US010242880B2

(12) United States Patent
Kim et al.

(10) Patent No.: US 10,242,880 B2
(45) Date of Patent: Mar. 26, 2019

(54) METHOD OF WET ETCHING AND METHOD OF FABRICATING SEMICONDUCTOR DEVICE USING THE SAME

(71) Applicants: Kwangsu Kim, Hwaseong-si (KR); Se-Ho Cha, Yongin-si (KR); Yongsun Ko, Suwon-si (KR); Keonyoung Kim, Seongnam-si (KR); Kyunghyun Kim, Seoul (KR); ChangSup Mun, Hwaseong-si (KR); Choongkee Seong, Seoul (KR); Sunjoong Song, Suwon-si (KR); Jinwoo Lee, Hwaseong-si (KR); Hoon Han, Anyang-si (KR)

(72) Inventors: Kwangsu Kim, Hwaseong-si (KR); Se-Ho Cha, Yongin-si (KR); Yongsun Ko, Suwon-si (KR); Keonyoung Kim, Seongnam-si (KR); Kyunghyun Kim, Seoul (KR); ChangSup Mun, Hwaseong-si (KR); Choongkee Seong, Seoul (KR); Sunjoong Song, Suwon-si (KR); Jinwoo Lee, Hwaseong-si (KR); Hoon Han, Anyang-si (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 15/645,419

(22) Filed: Jul. 10, 2017

(65) Prior Publication Data
US 2018/0102254 A1    Apr. 12, 2018

(30) Foreign Application Priority Data
Oct. 7, 2016    (KR) .................. 10-2016-0130052

(51) Int. Cl.
*H01L 21/311*    (2006.01)
*H01L 21/306*    (2006.01)
(Continued)

(52) U.S. Cl.
CPC .... *H01L 21/30604* (2013.01); *H01L 21/0217* (2013.01); *H01L 21/31111* (2013.01);
(Continued)

(58) Field of Classification Search
CPC ......... H01L 21/30604; H01L 21/31111; H01L 21/47573; H01L 21/67086
See application file for complete search history.

(56) References Cited

U.S. PATENT DOCUMENTS 6,503,363 B2    1/2003    Nakano et al.
6,780,277 B2    8/2004    Yokomizo et al.
(Continued)

FOREIGN PATENT DOCUMENTS

JP    2014072505 A    4/2014
KR    1020050070995 A    7/2005
(Continued)

*Primary Examiner* — Stephen W Smoot
(74) *Attorney, Agent, or Firm* — Myers Bigel, P.A.

(57) ABSTRACT

Disclosed are a method of wet etching and a method of fabricating a semiconductor device. The wet etching method includes providing a wafer in a process bath and an etchant is accommodated, supplying the process bath with a primary etchant to control a concentration of a specific material in the etchant, supplying the process bath with a first additive to increase the concentration of the specific material in the etchant, and supplying the process bath with a second additive to suppress a defect caused by an increase in the concentration of the specific material in the etchant. The etchant includes at least one, of the primary etchant, the first additive, and the second additive. The first additive and the second additive are separately supplied to the process bath.

17 Claims, 22 Drawing Sheets

(51) Int. Cl.
  *H01L 21/4757* (2006.01)
  *H01L 21/02* (2006.01)
  *H01L 21/67* (2006.01)
  *H01L 27/11582* (2017.01)
  *H01L 27/1157* (2017.01)
  *H01L 27/11565* (2017.01)

(52) U.S. Cl.
  CPC .. *H01L 21/47573* (2013.01); *H01L 21/67086* (2013.01); *H01L 27/1157* (2013.01); *H01L 27/11582* (2013.01); *H01L 27/11565* (2013.01)

(56) References Cited

U.S. PATENT DOCUMENTS

| | | |
|---|---|---|
| 8,940,182 B2 | 1/2015 | Hong |
| 9,368,647 B2 | 6/2016 | Hong |
| 2005/0067101 A1 | 3/2005 | Funabashi |
| 2009/0081881 A1* | 3/2009 | Kiyose .............. H01L 21/31111 438/753 |

FOREIGN PATENT DOCUMENTS

| | | |
|---|---|---|
| KR | 100527247 | 11/2005 |
| KR | 20130042273 | 4/2013 |
| KR | 101320416 B1 | 10/2013 |
| KR | 101391605 B1 | 5/2014 |

\* cited by examiner

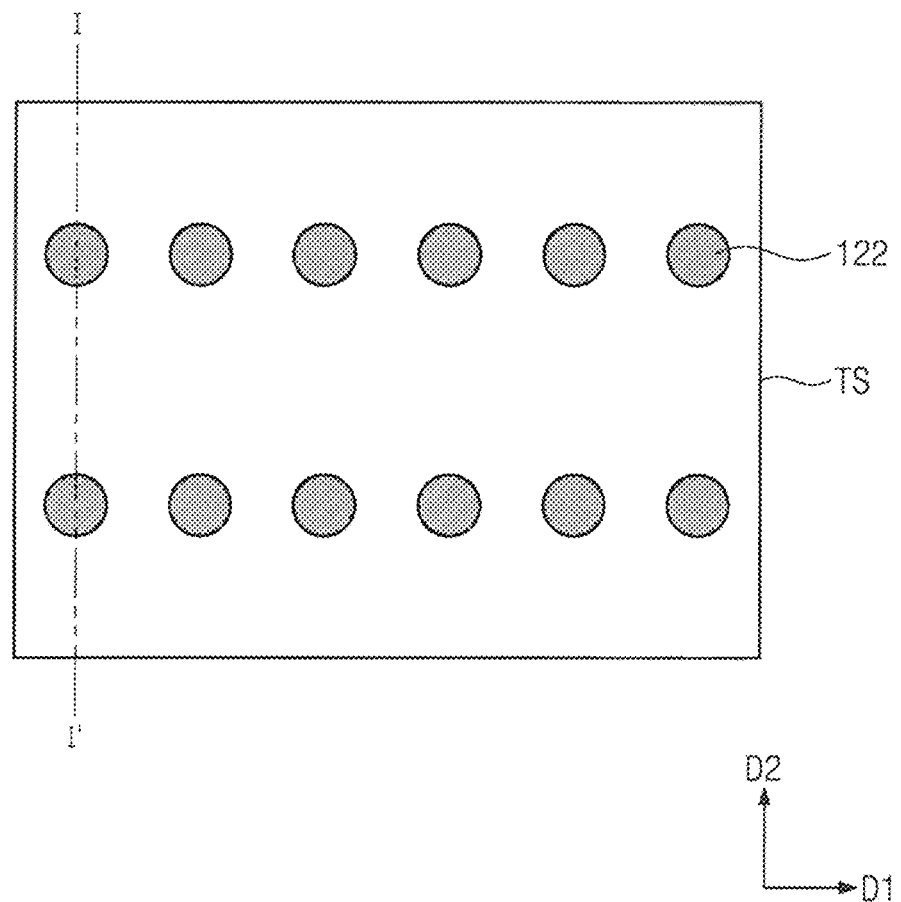

METHOD OF WET ETCHING AND METHOD OF FABRICATING SEMICONDUCTOR DEVICE USING THE SAME

CROSS-REFERENCE TO RELATED APPLICATIONS

This U.S. non-provisional patent application claims priority under 35 U.S.C. § 119 of Korean Patent Application 10-2016-0130052 filed on Oct. 7, 2016, the entire contents of which are hereby incorporated herein by reference.

FIELD

The present inventive concept relates to a method of wet etching that uses an etchant having an etch selectivity, and a method of fabricating a three-dimensional semiconductor device using the same.

BACKGROUND

Semiconductor devices have been highly integrated for satisfying high performance and low manufacture cost requirements that have been requested by users. Because integration of semiconductor devices may be an important factor in determining product price, highly integrated semiconductor devices are increasingly demanded. Integration of typical two-dimensional or planar semiconductor devices is primarily determined by the area occupied by a unit memory cell, such that it may be greatly influenced by the level of technology used for forming fine patterns. However, the processing equipment used to increase pattern fineness may be expensive and, therefore, may set a practical limitation on increasing the integration of two-dimensional or planar semiconductor devices.

To overcome such limitations, three-dimensional semiconductor memory devices having three-dimensionally arranged memory cells have been proposed. A method of fabricating the three-dimensional semiconductor memory device may include stacking thin layers on a substrate and selectively wet etching a portion of the stacked thin layers. In this case, the wet etching process may be performed using an etchant having an etch selectivity.

SUMMARY

Embodiments of the present inventive concept provide a method of wet etching capable of controlling an etch selectivity of an etchant and reducing or minimizing occurrence of defects.

Embodiments of the present inventive concept provide a method of fabricating a semiconductor device for manufacturing the semiconductor device and reducing or minimizing occurrence of defects.

According to exemplary embodiments of the present inventive concept, a method of wet etching may comprise: providing a wafer in a process bath, the process bath accommodating therein an etchant; supplying the process bath with a primary etchant to control a concentration of a specific material in the etchant; supplying the process bath with a first additive to increase the concentration of the specific material in the etchant; and supplying the process bath with a second additive to suppress a defect caused by an increase in the concentration of the specific material in the etchant. The etchant may comprise at least one of the primary etchant, the first additive, and the second additive. The first additive and the second additive may be separately supplied to the process bath.

According to exemplary embodiments of the present inventive concept, a method of fabricating a semiconductor device may comprise: forming a thin-layer structure including oxide layers and nitride layers alternately and repeatedly stacked on a substrate; forming a trench penetrating the thin-layer structure; and removing the nitride layers exposed through the trench. The step of removing the nitride layers may comprise: providing the substrate in a process bath where an etching process is performed to remove the nitride layers, the process bath accommodating therein an etchant; supplying the process bath with a first additive to increase a concentration of a specific material in the etchant; and supplying the process bath with a second additive to suppress a defect caused by an increase in the concentration of the specific material in the etchant. The first additive and the second additive may be separately supplied to the process bath.

According to exemplary embodiments of the present inventive concept, a method of wet etching may comprise: providing a wafer in a process bath where an etching process is performed, the process bath accommodating therein an etchant; supplying the process bath with a primary etchant; supplying the process bath with a first additive to increase a concentration of a specific material, in the etchant; and supplying the process bath with a second additive to suppress a defect caused by an increase in the concentration of the specific material in the etchant. The etchant may comprise at least one of the primary etchant, the first additive, and the second additive. The primary etchant may comprise phosphoric acid. The primary etchant may further comprise at least one material in common with at least one of the first additive and the second additive.

According to exemplary embodiments of the present inventive concept, a method may comprise: etching a substrate in a process bath using a primary etchant and a first additive; determining a concentration of a specific material in the process bath responsive to etching the substrate; adjusting a supply amount of the primary etchant and the first additive in the process bath based on the concentration of the specific material such that the concentration of the specific material is below a threshold that facilitates oxide growth; and supplying a second additive to the process bath that suppresses the oxide growth. It is noted that aspects of the inventive concepts described with respect to one embodiment, may be incorporated in a different embodiment although not specifically described relative thereto. That is, all embodiments and/or features of any embodiment can be combined in any way and/or combination. These and other aspects of the inventive concepts are described in detail in the specification set forth below.

BRIEF DESCRIPTION OF THE DRAWINGS

FIGS. 9A to 15A are plan views that illustrate a method of fabricating a semiconductor device using a wet etching method according to exemplary embodiments of the present inventive concept.

FIGS. 9B to 15B are cross-sectional views taken along line I-I' of FIGS. 9A to 15A, respectively.

DETAILED DESCRIPTION OF EMBODIMENTS

It will be hereinafter described in detail exemplary embodiments of the present inventive concept with reference to the accompanying drawings.

Figure 1:
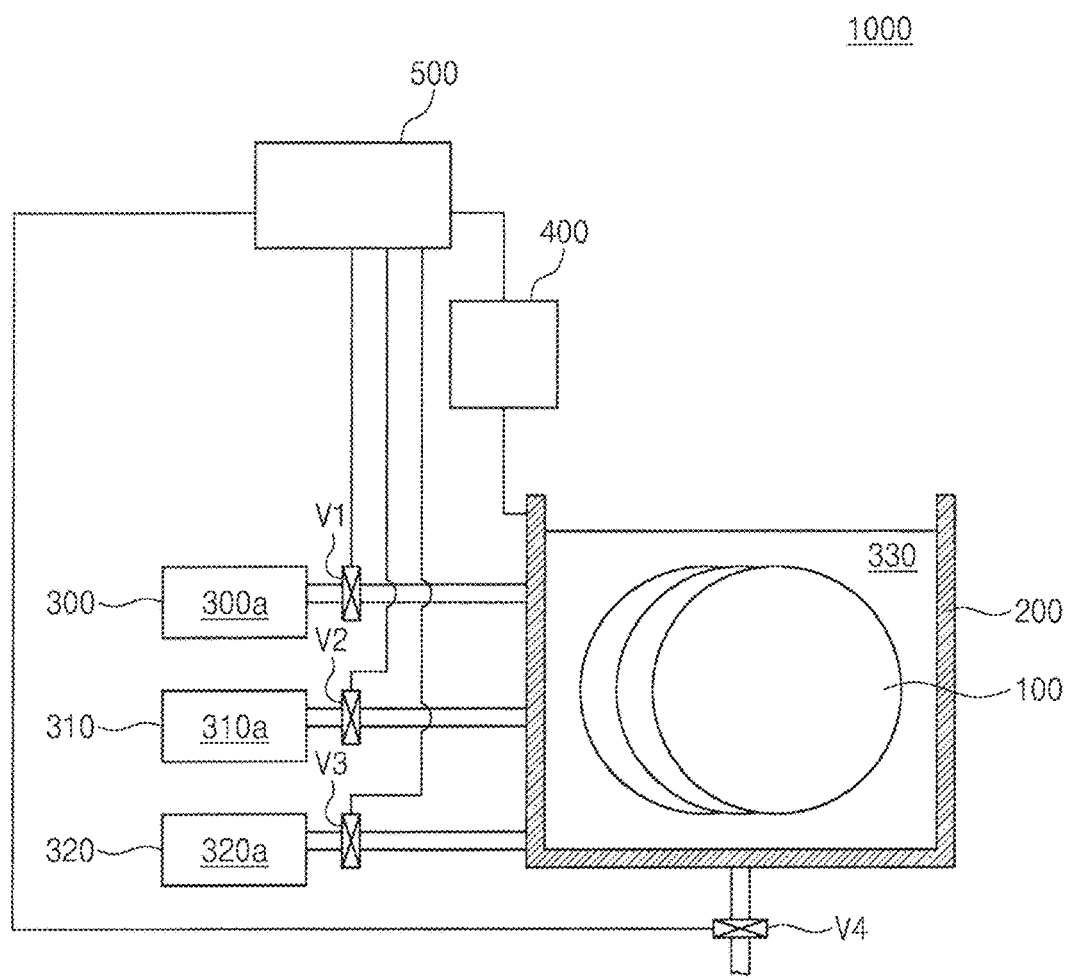
FIG. 1 is a schematic diagram illustrating a wet etching apparatus according to exemplary embodiments of the present inventive concept.

FIG. 1 is a schematic diagram illustrating a wet etching apparatus according to exemplary embodiments of the present inventive concept.

Referring to FIG. 1, a wet etching apparatus 1000 may include a process bath 200 in which an etching process is performed, a first supply unit 300 that supplies the process bath 200 with a primary etchant 300a, a second supply unit 310 that supplies the process bath 200 with a first additive 310a, and a third supply unit 320 that supplies the process bath 200 with a second additive 320a. The process bath 200 may accommodate therein an etchant 330, which may include at least one of the primary etchant 300a, the first additive 310a, and the second additive 320a. The wet etching apparatus 1000 may further include a detector 400 that detects a concentration of a specific material in the etchant 330 received in the process bath 200, and a controller 500 that controls supply amount and supply timing of each of the primary etchant 300a, the first additive 310a, and the second additive 320a. The detector 400 may detect the concentration of the specific material in the etchant 330 by using, for example, an absorption spectrometry. First, second, and third supply valves V1, V2, and V3 may be respectively engaged with the first, second, and third supply units 300, 310, and 320. The controller 500 may actuate the first to third supply valves V1 to V3 to control the supply amount and the supply timing of each of the primary etchant 300a, the first additive 310a, and the second additive 320a that are supplied to the process bath 200. The primary etchant 300a, the first additive 310a, and the second additive 320a may be separately supplied to the process bath 200 from corresponding first, second, and third supply units 300, 310, and 320. The controller 500 may be engaged with the detector 400, and may control the supply amount and the supply timing of each of the primary etchant 300a, the first additive 310a, and the second additive 320a, based on data, obtained from the detector 400, on the concentration of the specific material in the etchant 330. The wet etching apparatus 1000 may include a drain valve V4 engaged with the process bath 200. The controller 500 may control the drain valve V4 to constantly maintain a liquid surface height of the etchant 330 in the process bath 200.

An etching process using the etchant 330 may be performed in the process bath 200. The etching process may be performed using a batch processing. For example, a plurality of wafers 100 may be simultaneously soaked in the etchant 330 received in the process bath 200. In some embodiments, each of the wafers 100 may include thereon a nitride layer and an oxide layer stacked one on another, and the etching process may be used to selectively etch the nitride layer from each of the wafers 100. In this case, the etchant 330 may exhibit a smaller etch rate for the oxide layer than for the nitride layer. That is, the etchant 330 may have an etch selectivity to the oxide layer.

In some embodiments, each of the wafers 100 may include thereon a silicon nitride layer and a silicon oxide layer stacked one on another, and the etchant 330 may have an etch selectivity to the silicon oxide layer. For example, the etchant 330 may include the primary etchant 300a supplied from the first supply unit 300, and the primary etchant 300a may have an etch selectivity to the silicon oxide layer. In other words, the primary etchant 300a may exhibit a smaller etch rate for the silicon oxide layer than for the silicon nitride layer. The primary etchant 300a may be, for example, phosphoric acid. Alternatively, the primary etchant 300a may include phosphoric acid and further include a specific material or compound the same as that of at least one of the first and second additives 310a and 320a. The etchant 330 may further include the first additive 310a supplied from the second supply unit 310. The first additive 310a may increase the concentration of the specific material in the etchant 330. For example, the first additive 310a may include a silicon compound, and the concentration of the specific material in the etchant 330 may be concentration of silicon in the etchant 330. As the silicon concentration in the etchant 330 increases, an etch selectivity of the etchant 330 to the silicon oxide layer may increase. The etchant 330 may further include the second additive 320a supplied from the third supply unit 320. The second additive 320a may reduce defects caused by an increase in the concentration of the specific material in the etchant 330. For example, the second additive 320a may not include a silicon source but include a material that suppresses supersaturation of silicon in the etchant 330. The second additive 320a may include, for example, an ammonium compound.

To perform an etching process, for selectively etching the silicon nitride layer in the process bath 200, the process bath 200 may be supplied with the primary etchant 300a. In addition, to inhibit loss of the silicon oxide layer during the etching process, the process bath 200 may be supplied with the first additive 310a. The detector 400 may detect the silicon concentration of the etchant 330, and the controller 500 may control the supply amount and the supply timing of each of the primary etchant 300a and the first additive 310a so as to allow the etchant 330 to have a desired or predetermined silicon concentration. As the silicon nitride layer is etched by the etching process, the silicon concentration in the etchant 330 may increase. The controller 500 may control the supply amount and the supply timing of the second additive 320a to suppress defects caused by an increase of the silicon concentration in the etchant 330.

It will be hereinafter described a wet etching method using the wet etching apparatus of FIG. 1.

Figure 2:
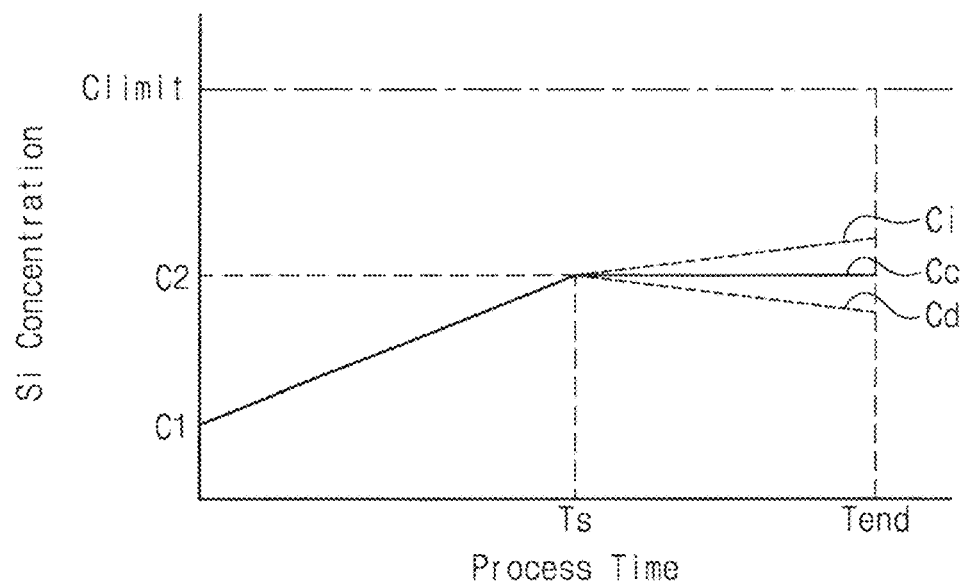
FIG. 2 is a graph that illustrates an example of a wet etching method according to exemplary embodiments of the present inventive concept.

FIG. 2 is a graph that illustrates an example of a wet etching method according to exemplary embodiments of the present inventive concept. FIGS. 3 to 7 are conceptual diagrams that illustrate a wet etching method according to exemplary embodiments of the present inventive concept.

Referring to FIG. 1, the process bath 200 may accommodate therein the etchant 330. The etchant 330 may include the primary etchant 300a supplied from the first supply unit 300. The primary etchant 300a may be, for example, phosphoric acid. Alternatively, in other embodiments, the primary etchant 300a may include phosphoric acid and further include a specific material the same as that of at least one of the first and second additives 310a and 320a. The detector 400 may detect the silicon concentration in the etchant 330.

Figure 3:
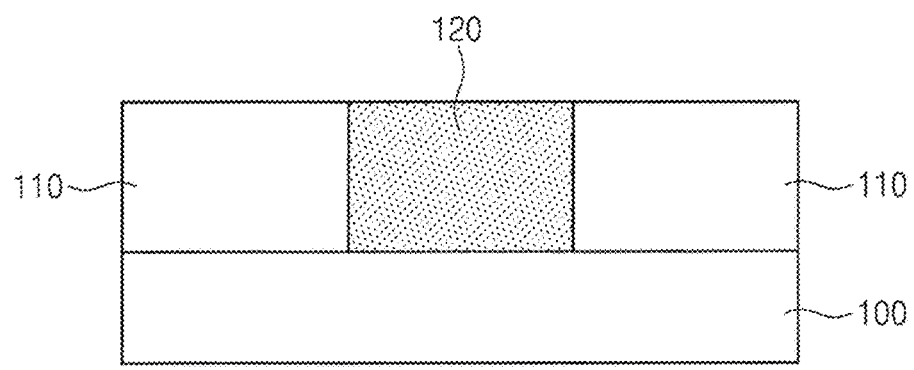
FIGS. 3 to 7 are conceptual diagrams that illustrate a wet etching method according to exemplary embodiments of the present inventive concept.

Referring to FIGS. 1, 2, and 3, the silicon concentration in the etchant 330 may have a desired or predetermined value C1. When the silicon concentration in the etchant 330 less than the desired or predetermined value C1, the first additive 310a may be separately supplied to the process bath 200. The first additive 310, and the primary etchant 300a may be supplied separately from each other. The process bath 200 may be provided therein with a plurality of wafers 100 to allow the delimit 330 to receive the plurality of wafers 100 at the same time. As shown in FIG. 3, each of the wafers 100 may include thereon a silicon oxide layer 110 and a silicon nitride layer 120. An etching process for selectively etching the silicon nitride layer 120 may be performed in the process bath 200. In this case, as the silicon concentration in the etchant 330 has the desired or predetermined value C2, the etchant 330 may have a desired etch selectivity to the silicon oxide layer 110. Accordingly, loss of the silicon oxide layer 110 may be suppressed during the etching process.

Figure 4:
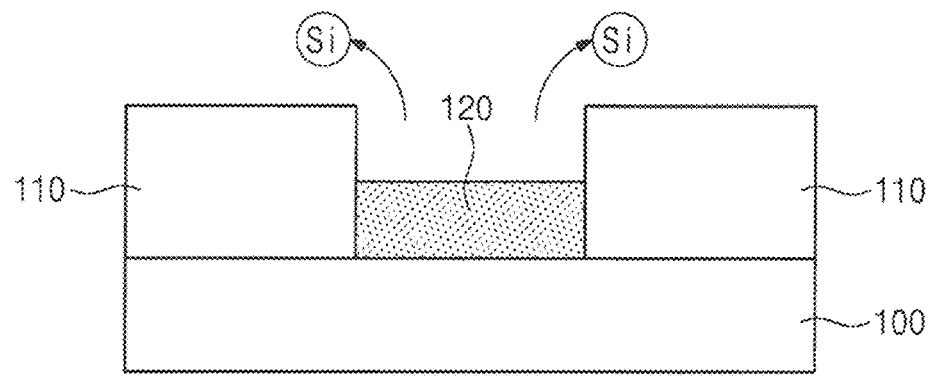

Referring to FIGS. 1, 2, and 4, as the silicon nitride layer 120 is etched, the silicon concentration in the defiant 330 may increase during the etching process. In detail, the etchant 330 may include silicon (Si) generated by the etching of the silicon nitride layer 120, and, thus, the silicon concentration in the etchant 330 may increase during the etching process. When the silicon concentration in the etchant 330 reaches a limit value $C_{limit}$, a thickness of the silicon oxide layer 110 may increase due to oxide growth (referred to hereinafter as an abnormal growth phenomenon) on a surface of the silicon oxide layer 110. To suppress the abnormal growth phenomenon, in some embodiments, the process, bath 200 may be supplied with the second additive 320a during the etching process. The second additive 320a may be continuously supplied to the process bath 200 from an initial time when the etching process starts. Alternatively, the second additive 320a may be supplied to the process bath 200 when the silicon concentration of the etchant 330 reaches a certain value C2. As the process bath 200 is supplied with the second additive 320a, the abnormal growth phenomenon may be suppressed even when the silicon concentration in the etchant 330 exceeds the limit value $C_{limit}$. The etching process may, thus, be performed even when the silicon concentration in the etchant 330 is above the limit value $C_{limit}$. When the second additive 320a includes an ammonium compound, the second additive 320a may dissolve in the etchant 330 to produce ammonium ions. The ammonium ions may suppress the oxide growth on the surface of the silicon oxide layer 110.

The second additive 320a may be supplied separately from the first additive 310a and the primary etchant 300a. In detail, for example, the second additive 320a may be separately supplied to the process bath 200 from the initial time when the etching process starts. Alternatively, the process bath 200 may be supplied with the second additive 320a at a specific time Ts when the silicon concentration in the etchant 330 reaches the certain value C2. The process bath 200 may be continuously or discontinuously supplied with the second additive 320a for a duration from the initial time when, the etching process starts to an end time $T_{end}$ when the etching process ends, or a duration from the specific time Ts to the end time $T_{end}$.

Depending on amounts of the first additive 310a and the primary etchant 300a supplied to the process bath 200, the silicon concentration in the etchant 330 may be controlled to be substantially constant (Cc), increased (Ci), or decreased (Cd) within a desired concentration range for a duration from the initial time when the etching process starts to an end time $T_{end}$ when the etching process ends, or a duration from the specific time Ts to the end time $T_{end}$. The etchant 330 may, thus, be controlled to have an etch selectivity to the silicon oxide layer 110.

Figure 5:
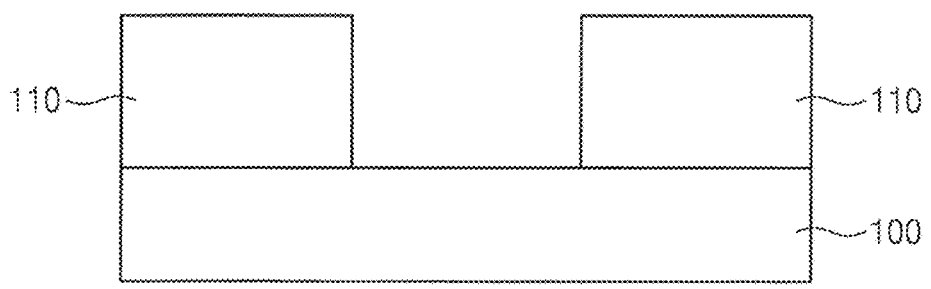
Figure 6:
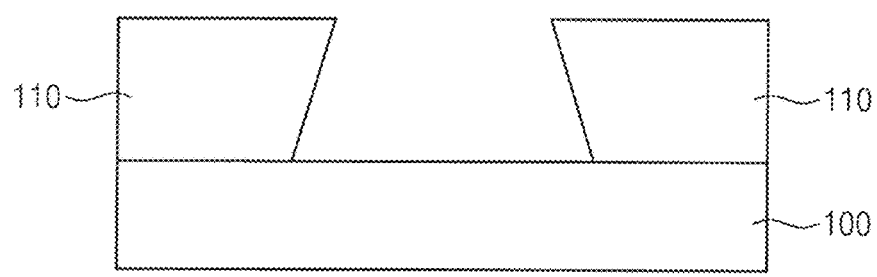
Figure 7:
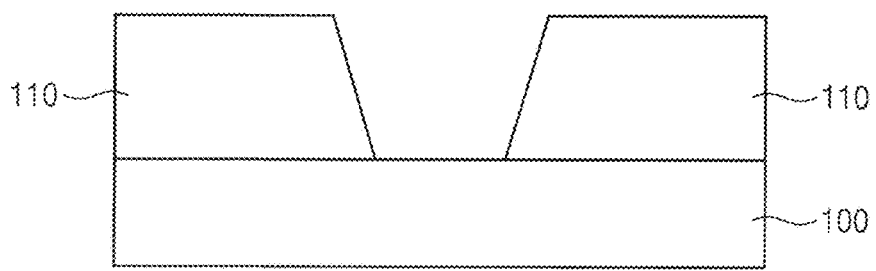

Referring to FIGS. 2 and 5 to 7, as the silicon concentration in the etchant 330 is variously controlled within the desired concentration range during the etching process, a surface profile of the silicon oxide layer 110 may be diversely controlled. For example, when the silicon concentration in the etchant 330 is controlled to be substantially constant (Cc) within the desired concentration range for a duration from the specific time Ts to the end time $T_{end}$ as shown in FIG. 5, loss of the silicon oxide layer 110 may be reduced or minimized during the etching process. For another example, when the silicon concentration in the etchant 330 is controlled to be substantially decreased (Cd) within the desired concentration range for a duration from the specific time Ts to the end time $T_{end}$, the etchant 330 may have a decreased etch selectivity to the silicon oxide layer 110. Accordingly, as shown in FIG. 6, the silicon oxide layer 110 may be etched more at its lower portion than at its upper portion during the etching process. In other words, the silicon oxide layer 110 may have a sidewall profile that becomes more laterally recessed toward a top surface of the wafer 100. In another example, when the silicon concentration in the etchant 330 is controlled to be substantially increased (Ci) within the desired concentration range for a duration from the specific time Ts to the end time $T_{end}$, the etchant 330 may exhibit an increased etch selectivity to the silicon oxide layer 110. Accordingly, as shown in FIG. 7, the silicon oxide layer 110 may be etched less at its lower portion adjacent to the top surface of the wafer 100 than at its upper portion during the etching process. In other words, the silicon oxide layer 110 may have a sidewall profile that becomes more laterally recessed away from the top surface of the wafer 100.

Figure 8:
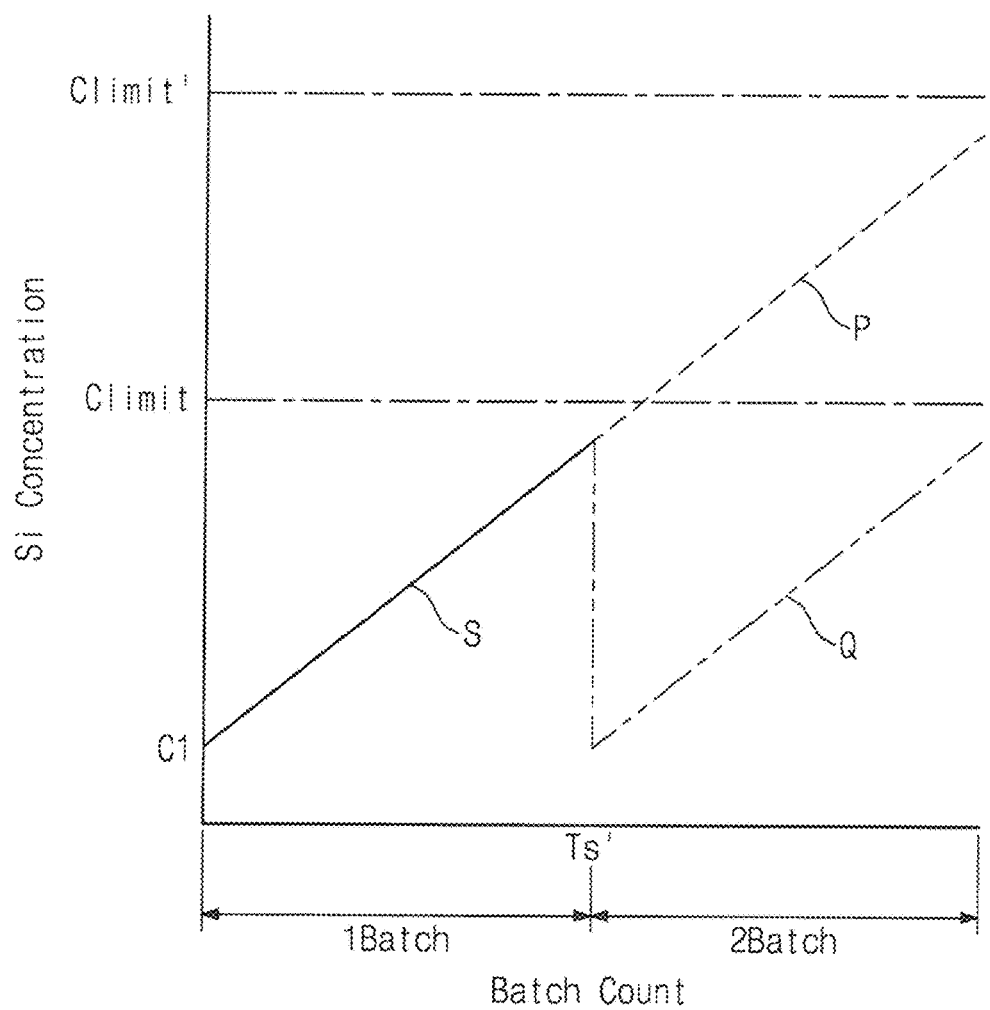
FIG. 8 is a graph that illustrates a further example of a wet etching method according to exemplary embodiments of the present inventive concept.

FIG. 8 is a graph that illustrates another example of a wet etching method according to exemplary embodiments of the present inventive concept. For brevity of the description, explanation of the example of the wet etching method described with reference to FIGS. 2 to 7 will be omitted to avoid duplication.

Referring to FIGS. 1, 3, and 8, the process bath 200 may accommodate therein the etchant 330. The etchant 330 may include the primary etchant 300a supplied from the first supply unit 300. The silicon concentration in the etchant 330 may have the desired or predetermined value C1. When the etchant 330 has a silicon concentration less than the desired or predetermined value C1, the first additive 310a may be separately supplied to the process bath 200. The first additive 310a and the primary etchant 300a may be supplied separately from each other. The process bath 200 may be provided therein with a plurality of wafers 100 to allow the etchant 330 to receive the plurality of wafers 100 at the same time. As shown in FIG. 3, each of the wafers 100 may include thereon the silicon oxide layer 110 and, the silicon nitride layer 120. An etching process for selectively etching the silicon nitride layer 120 may be performed in the process bath 200. The etching process on the plurality of wafers 100 may be defined so as to be referred to as a first batch processing 1Batch.

Referring to FIGS. 1, 4, and 8, as the silicon nitride layer 120 is etched, the silicon concentration in the etch 330 may increase during the etching process (i.e., the first batch processing 1Batch).

Referring to FIGS. 1, 5, and 8, the first batch processing 1Batch may selectively etch the silicon nitride layer 120. The silicon concentration in the etchant 330 may increase during the first batch processing 1Batch, and, thus, loss of the silicon oxide layer 110 may be reduced or minimized during the first batch processing 1Batch. After the first batch processing 1Batch is terminated, the plurality of wafers 100 may be unloaded from the process bath 200. Thereafter, an additional plurality of wafers 100 may be provided in the process bath 200 and simultaneously soaked in the etchant 330. An etching process may be performed to selectively etch the silicon nitride layer 120 in the process bath 200, and the etching process on the additional plurality of wafers 100 may be defined so as to be referred to as a second batch processing 2Batch.

Referring to line P of FIG. 8, after the first batch processing 1Batch, the silicon concentration in the etchant 330 may have a value closer to the limit value $C_{limit}$. When the second batch processing 2Batch is performed using the etchant 330, the silicon concentration in the etchant 330 may increase to reach the limit value $C_{limit}$. In this case, the abnormal growth phenomenon discussed above may occur. To suppress the abnormal growth phenomenon, in some embodiments, the process bath 200 may be supplied with the second additive 320a at a time Ts' after the first batch processing 1Batch and before the second batch processing 2Batch. The second additive 320a may be supplied separately from the first additive 310a and the primary etchant 300a. As the process bath 200 is supplied with the second additive 320a, the abnormal growth phenomenon may be suppressed even when the silicon concentration in the etchant 330 exceeds the limit value $C_{limit}$. The second batch processing 2Batch may, thus, be performed even when the silicon concentration in the etchant 330 is above the limit value $C_{limit}$. That is, a limit value of the silicon concentration in the etchant 330 may increase ($C_{limit} \rightarrow C_{limit}'$).

Referring to line Q of FIG. 8, to decrease the silicon concentration in, the etchant 330, the process bath 200 may be supplied with, the primary etchant 300a at the time Ts' after the first batch processing 1Batch and before the second batch processing 2Batch. The primary etchant 300a may be supplied separately from the first additive 310a and the second additive 320a. As the process bath 200 is supplied with the primary etchant 300a, the etchant 330 may have a decreased silicon concentration. For example, the primary etchant 300a may be supplied to the process bath 200 so as to allow the silicon concentration in the etchant 330 to have the desired or predetermined value C1. The etchant 330 may then have a desired etch selectivity to the silicon oxide layer 110 during the second batch processing 2Batch, and, as the silicon concentration in the etchant 330 decreases below the limit value $C_{limit}$, the abnormal growth phenomenon may be suppressed. In some embodiments, the process bath 200 may be simultaneously supplied with the primary etchant 300a and the second additive 320a at the time Ts' after the first batch processing Batch and before the second batch processing 2Batch. The primary etchant 300a may be supplied to the process bath 200 so as to allow the silicon concentration in the etchant 330 to have the desired or predetermined value C1. The etchant 330 may, thus, have a desired etch selectivity to the silicon oxide layer 110 during the second batch processing 2Batch. In addition, as the process bath 200 is supplied with the second additive 320a the abnormal growth phenomenon may be suppressed.

As the primary etchant 300a and the first additive 310 are controlled on their amounts supplied to the process bath 200 during the first batch processing 1Batch, it may be possible to control an increasing slope S of the silicon concentration in the etchant 330. In this case, as discussed with reference to FIG. 7, it may also be possible to control the etch selectivity of the etchant 330 to the silicon oxide layer 110. The sidewall profile of the silicon oxide layer 110 may be configured based on controlling the etch selectivity of the etchant 330.

According to embodiments of the present inventive concept, the primary etchant 300a, the first additive 310a, and the second additive 320a may be separately supplied to the process bath 200 where the etching process is performed. As the primary etchant 300a, the first additive 310a, and the second additive 320a are separately controlled with respect to their supply amounts and supply timings into the process bath 200, it may be possible to control the silicon concentration in the etchant 330 accommodated in the process bath 200 and also to suppress the abnormal growth phenomenon that may occur during the etching process. As a result, an etch selectivity of the etchant 330 may be controlled and the abnormal growth phenomenon that may occur during the etching process may be suppressed.

Figure 16:
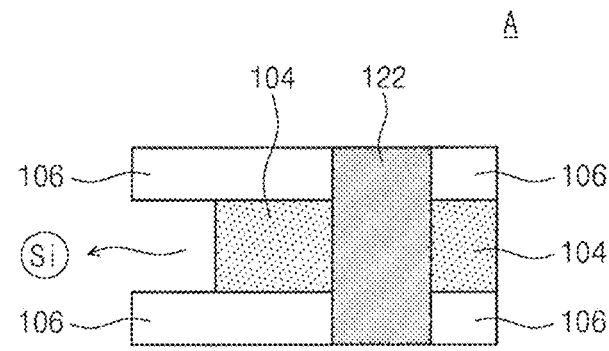
FIG. 16 is an enlarged view of section A shown in FIG. 12B.
Figure 17:
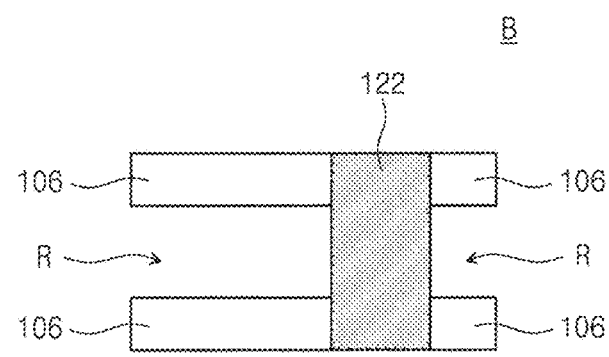
FIGS. 17 to 19 are enlarged views of section B shown in FIG. 13B.
Figure 18:
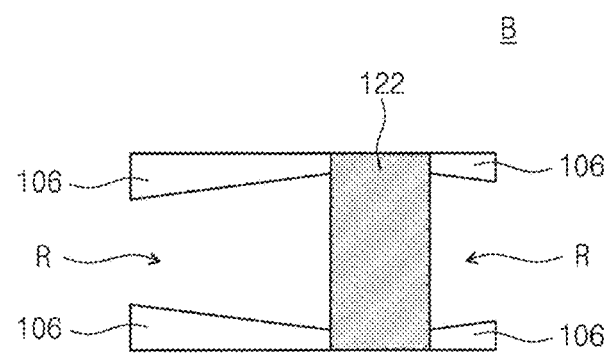
Figure 19:
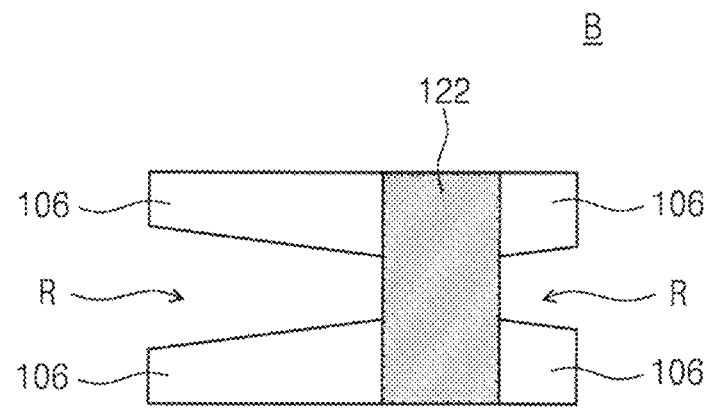
Figure 20:
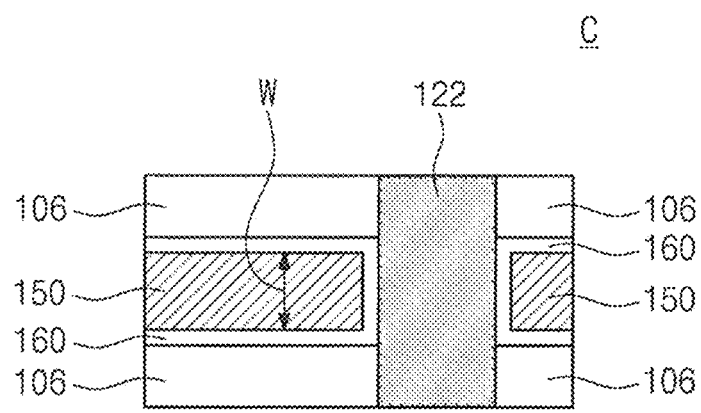
FIGS. 20 to 22 are enlarged views of section C shown in FIG. 14B.
Figure 21:
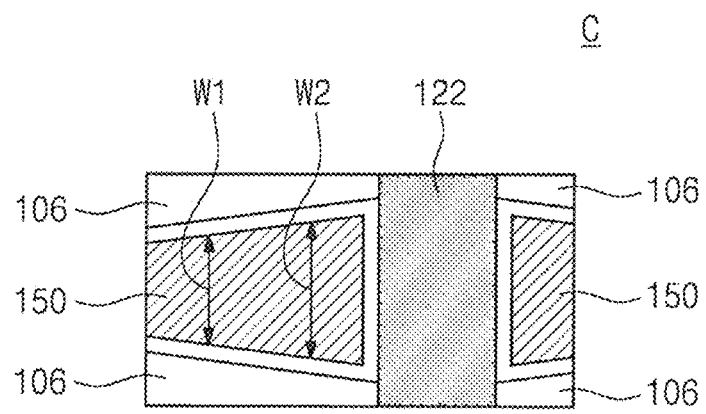
Figure 22:
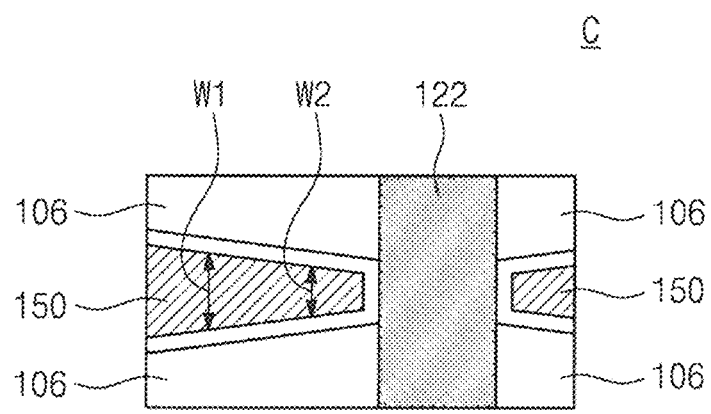

FIGS. 9A to 15A are plan views that illustrate a method of fabricating a semiconductor device using a wet etching method according to exemplary embodiments of the present inventive concept. FIGS. 9B to 15B are cross-sectional views taken along line I-I' of FIGS. 9A to 15A, respectively. FIG. 16 is an enlarged view of section A shown in FIG. 12B. FIGS. 17 to 19 are enlarged views of section B shown in FIG. 13B. FIGS. 20 to 22 are enlarged views of section C shown in FIG. 14B.

Figure 9A:
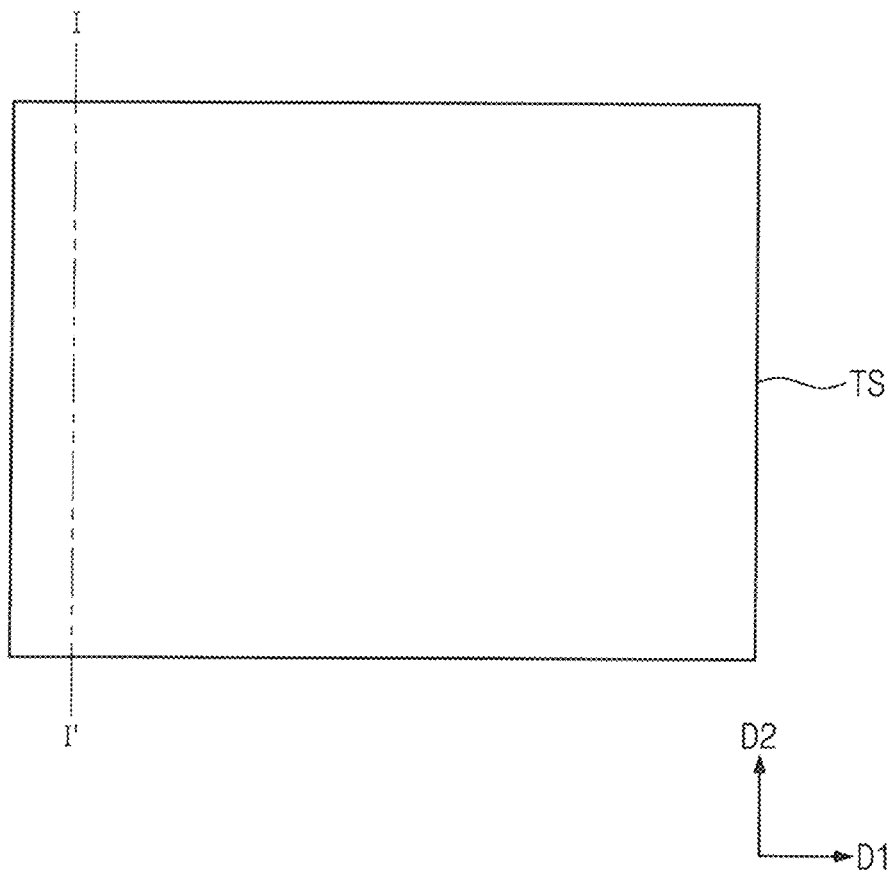
Figure 9B:
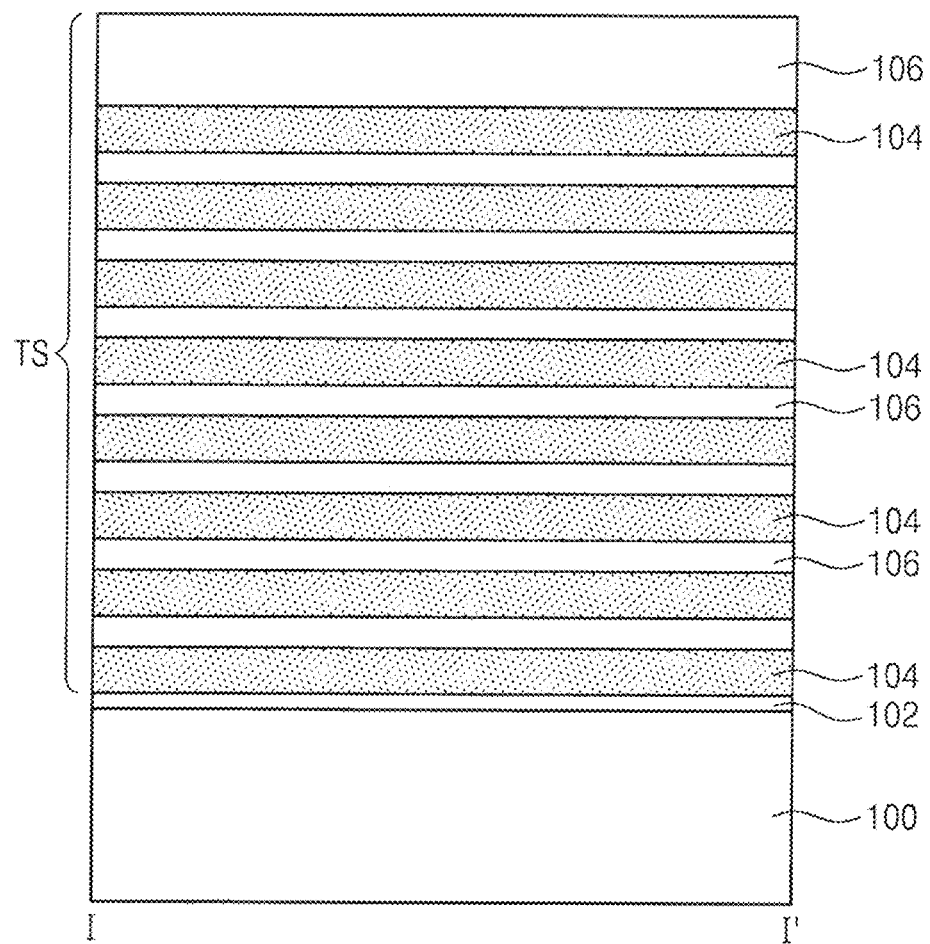

Referring to FIGS. 9A and 9B, a lower insulation layer 102 may be formed on a substrate 100. The substrate 100 may be, for example, a silicon substrate, a germanium substrate, or a silicon-germanium substrate. For example, the lower insulation layer 102 may be a silicon oxide layer formed by a thermal oxidation layer or a silicon nitride layer formed by a deposition process. A thin-layer structure TS may be formed by alternately and repeatedly depositing sacrificial layers 104 and insulation layers 106 on the lower insulation layer 102. In some embodiments, the sacrificial layers 104 may be formed to have the same thickness. In other embodiments, lowermost and uppermost ones of the sacrificial layers 104 may be formed to be thicker than other ones of the sacrificial layers 104 between the lowermost and uppermost ones of the sacrificial layers 104. The insulation layers 106 may have the same thickness, or alternatively, one or more of the insulation layers 106 may have different thicknesses from other ones of the insulation layers 106. The lower insulation layer 102 may have a thickness less than those of its overlying sacrificial and insulation layers 104 and 106. The sacrificial layers 104 and the insulation layers 106 may be formed using chemical vapor deposition (CVD), plasma enhanced CVD, a physical CVD process, and/or atomic layer deposition (ALD) in accordance with various embodiments of the present inventive concept. In some embodiments, the sacrificial layers 104 may include a material having an etch selectivity different from that of the insulation layers 106. For example, the sacrificial layers 104 may be formed of a silicon nitride layer, and the insulation layers 106 may be formed of a silicon oxide layer.

Figure 10A:
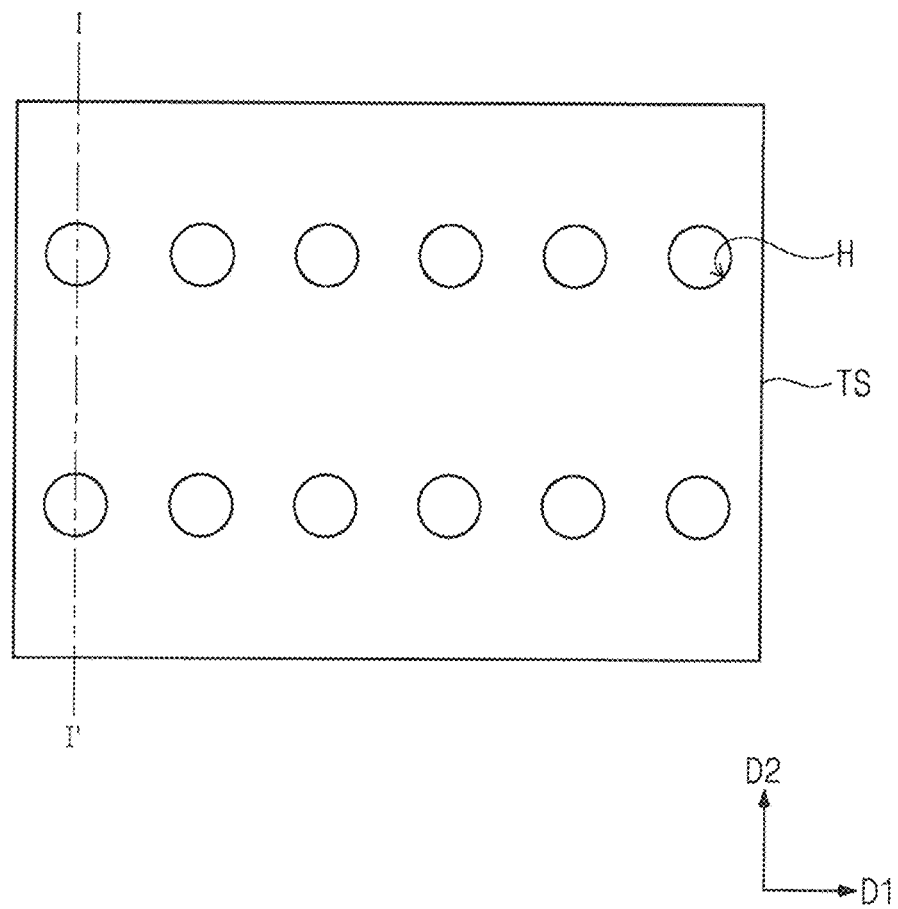
Figure 10B:
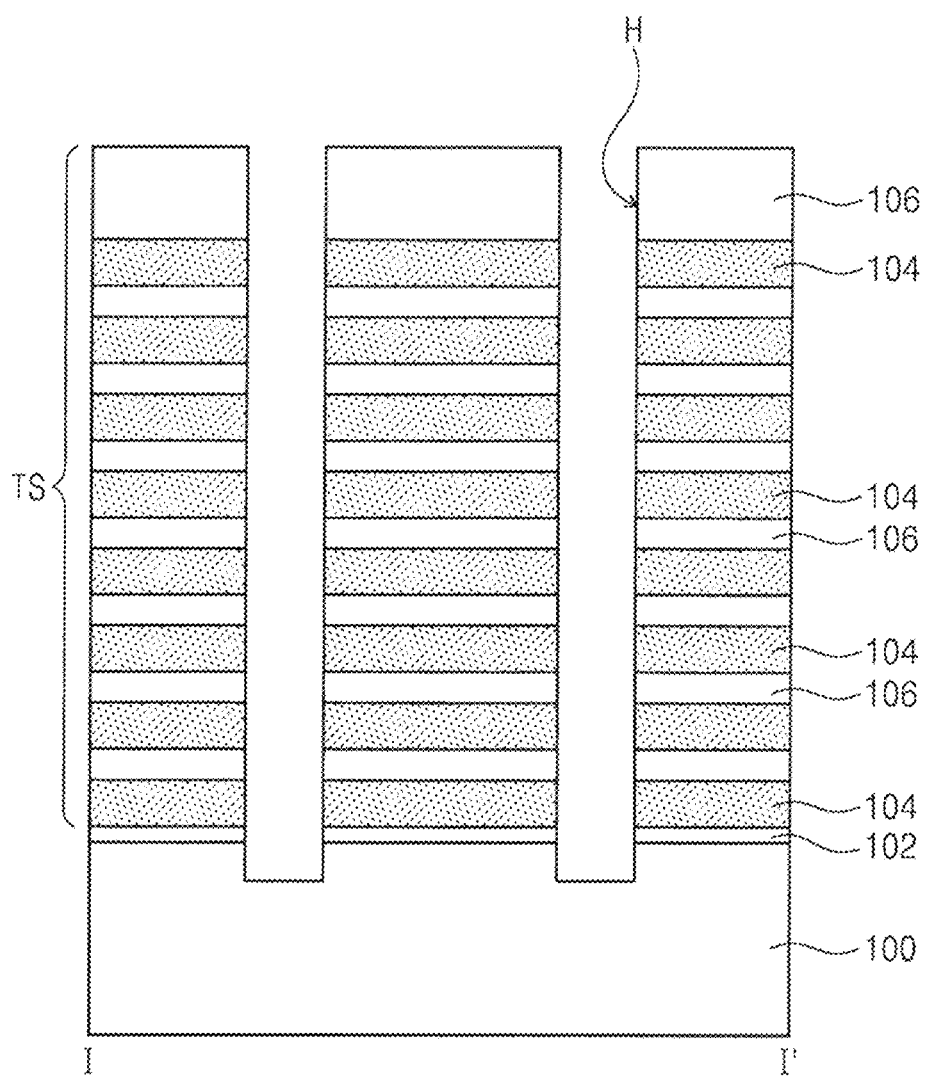

Referring to FIGS. 10A and 10B, the thin-layer structure TS may include therethrough a through hole H formed to expose the substrate 100. The through hole H may be provided in plural in the thin-layer structure TS, and, as viewed in plan, a plurality of through holes H may be two-dimensionally formed on a top surface of the thin-layer structure TS. In some embodiments, the through holes H may be arranged to constitute one column along a first direction D1. In other embodiments, the through holes H may be zigzag arranged along the first direction D1.

The formation of the through holes 14 may include forming on the thin-layer structure TS a first mask pattern having an opening to define an area where the through hole H is formed, and performing an anisotropic etching process on the thin-layer structure TS using the first mask pattern as an etching mask. The first mask pattern may be formed of a material having an etch selectivity to the sacrificial layers 104 and the insulation layers 106. The etching process may over-etch a top surface of the substrate 100, thereby recessing the top surface of the substrate 100. The through hole H may, thus, penetrate at least a portion of the substrate 100.

Figure 11B:
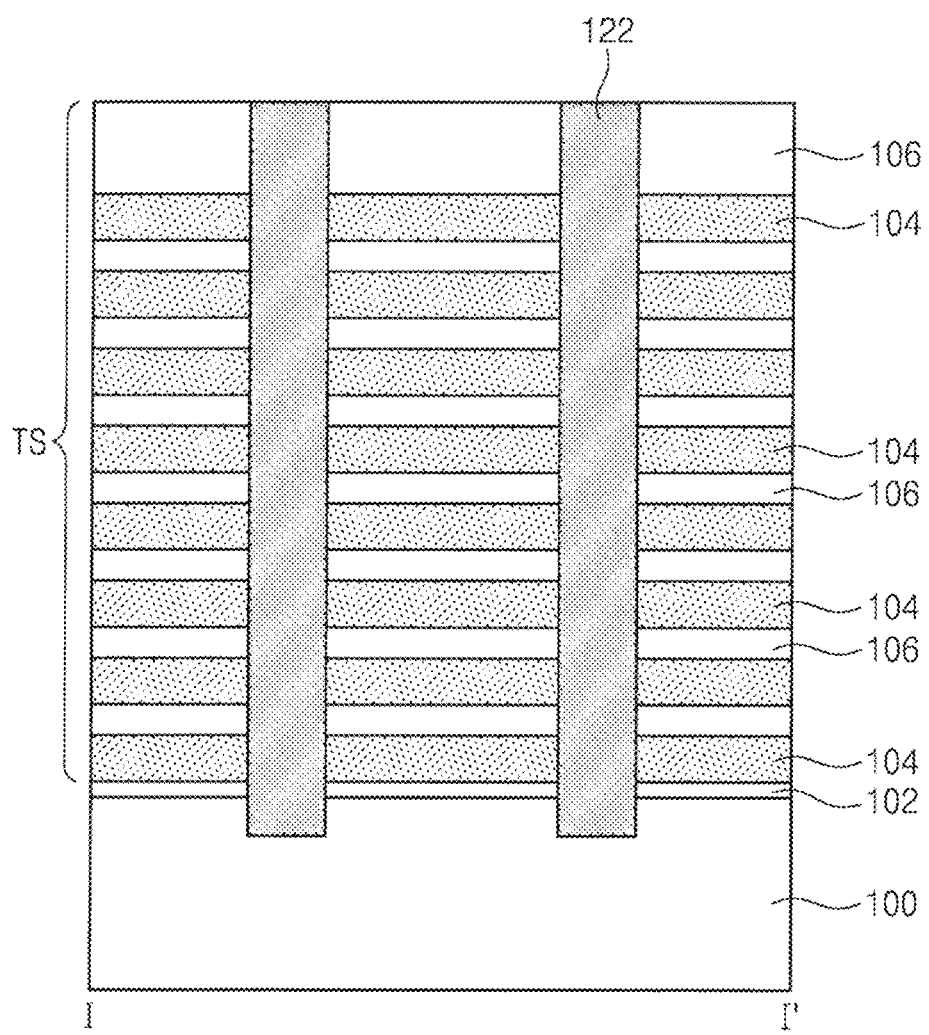

Referring to FIGS. 11A and 11B, a semiconductor pattern 122 may be formed in the through hole H. In some embodiments, the semiconductor pattern 122 may be formed to have a pillar shape that penetrates at least a portion of the substrate 100. The formation of the semiconductor pattern 122 may include forming on the thin-layer structure TS a semiconductor layer to fill the through hole H, and performing a planarization process on the semiconductor layer until the top surface of the thin-layer structure TS is exposed. The semiconductor layer may include one or more of a semiconductor material (e.g., a polycrystalline silicon layer, a single crystalline silicon layer, and an amorphous silicon layer) formed using one of atomic layer deposition (ALD) and chemical vapor deposition (CVD) technologies. The planarization process may cause the semiconductor pattern 122 to form locally in the through hole H.

Figure 12A:
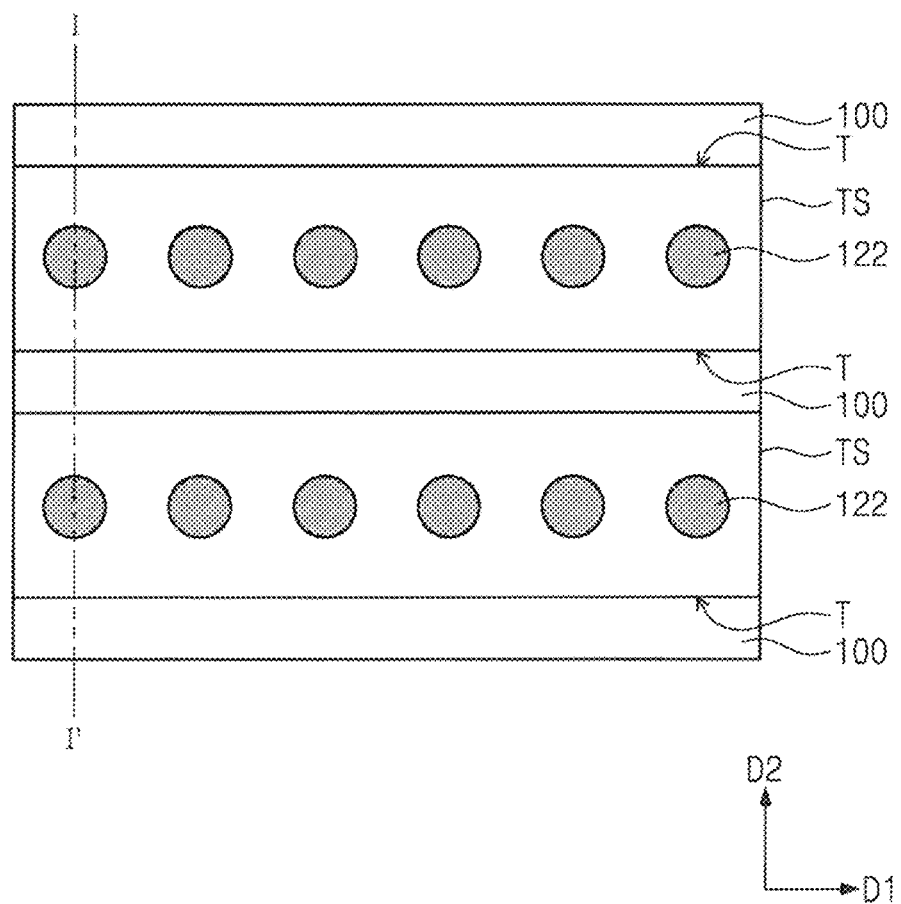
Figure 12B:
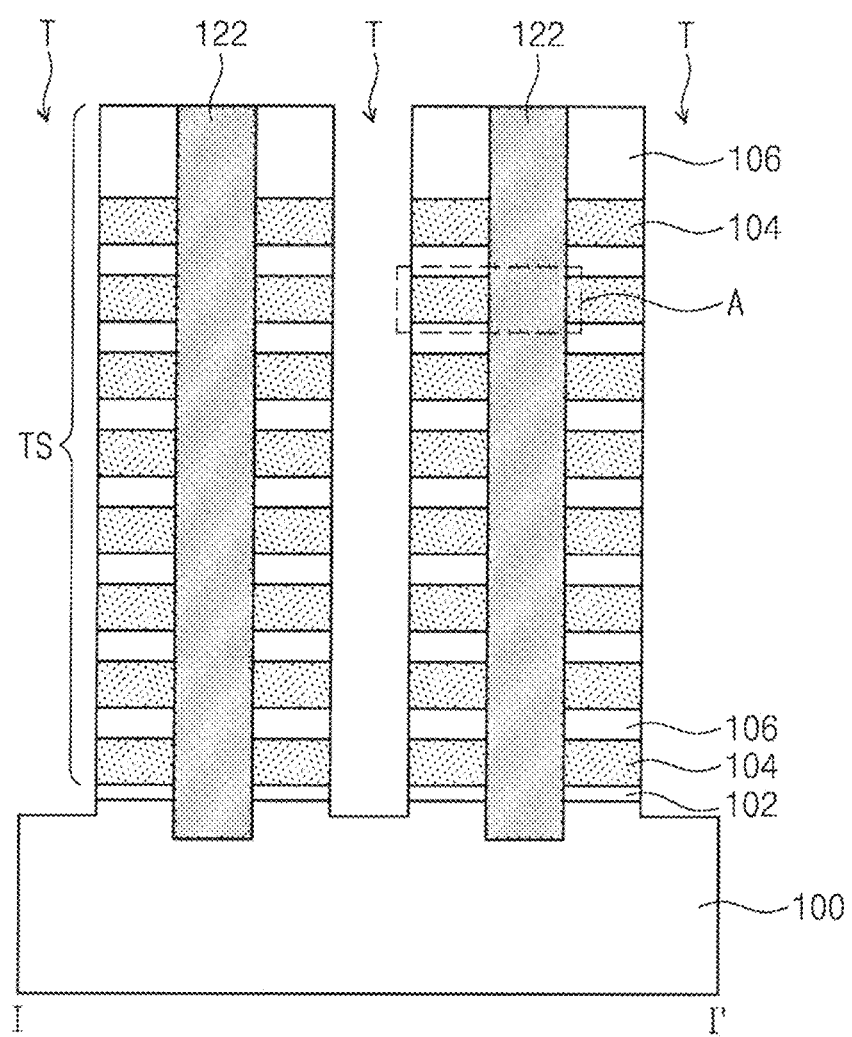

Referring to FIGS. 12A and 12B, the thin-layer structure TS may be patterned to form a trench T between adjacent semiconductor patterns 122 through which the substrate 100 is exposed. The formation of the trench T may include forming on the thin-layer structure TS a second mask pattern to define a planar position where the trench F is formed, and performing an anisotropic etching process on the thin-layer structure TS using the second mask pattern as an etching mask. The trench T may be formed spaced apart from the semiconductor pattern 122 and so as to expose sidewalls of the sacrificial layers 104 and the insulation layers 106. The trench T may be formed to have a linear or rectangular shape in plan view and to expose the top surface of the substrate 100 in sectional view. The top surface of the substrate 100 may be over-etched during the etching process, which may recess an upper portion of the substrate 100. The formation of the trench T may allow the thin-layer structure TS to have a linear shape extending in the first direction D1. A single linear shaped thin-layer structure TS may be penetrated with a plurality of the semiconductor patterns 122.

Figure 13A:
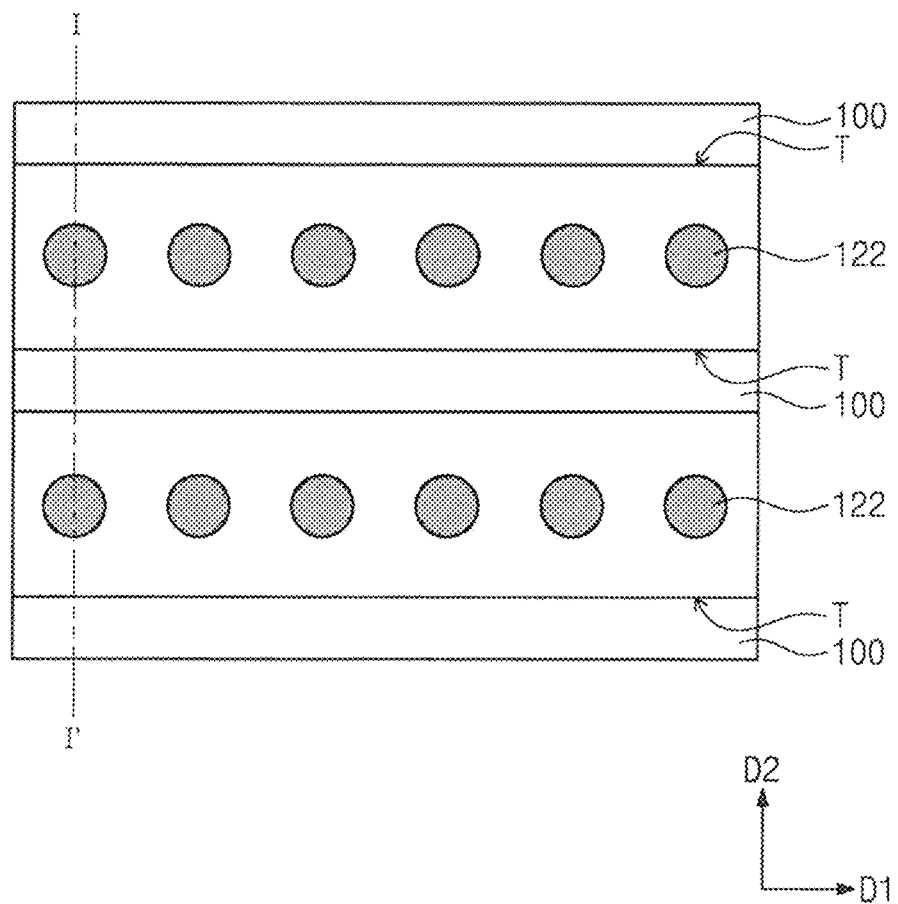
Figure 13B:
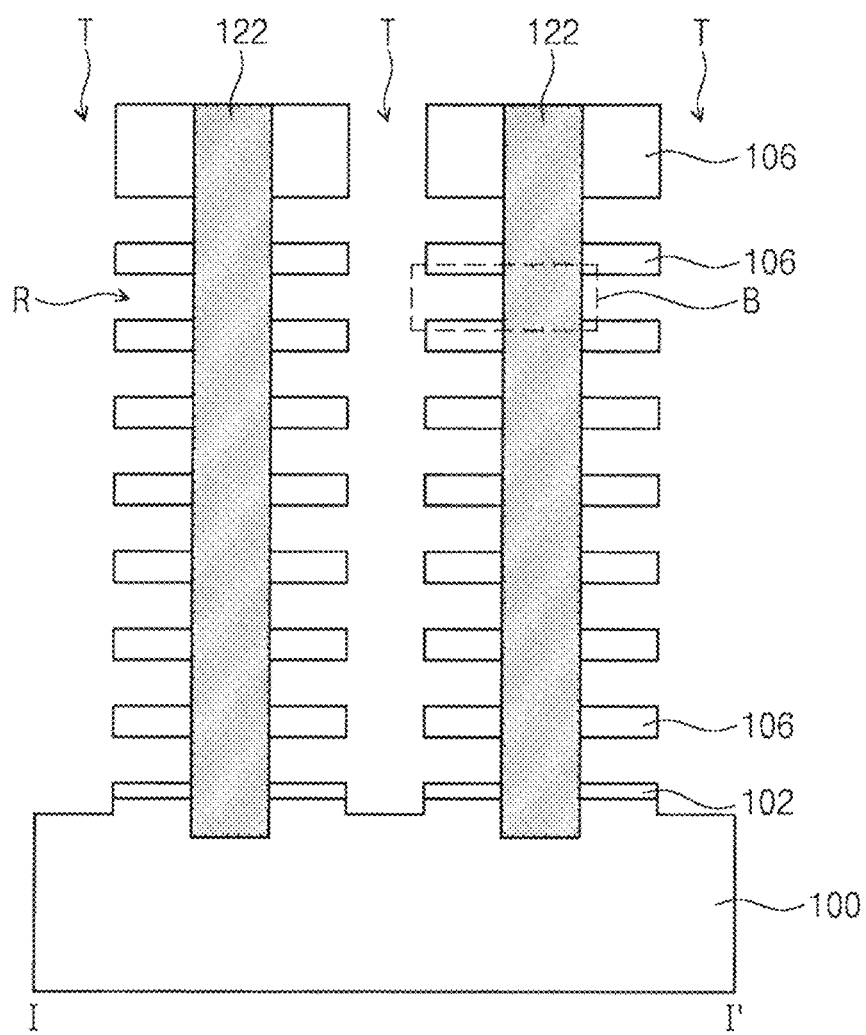

Referring to FIGS. 13A and 13B, the sacrificial layers 104 exposed through the trench T may be removed to form recess regions R between the insulation layers 106. The recess regions R may be formed by performing an isotropic etching process on the sacrificial layers 104 using an etching recipe that exhibits an etch selectivity to the insulation layers 106, the semiconductor pattern 122, the lower insulation layer 103, and the substrate 100. The isotropic etching process may substantially or completely remove the sacrificial layers 104. For example, when the sacrificial layers 104 include a silicon nitride layer and the insulation layers 106 include a silicon oxide layer, the etching process may be a wet etching process that uses an etchant including phosphoric acid.

In some embodiments of the present inventive concept, the wet etching process described above with reference to FIGS. 2 to 7 may be used to form the recess regions R.

In detail, referring to FIG. 1, the process bath 200 may accommodate therein the etchant 330. The etchant 330 may include the primary etchant 300a supplied from the first supply unit 300. The primary etchant 300a may be, for example, phosphoric acid. Alternatively, the primary etchant 300a may include phosphoric acid and further include a material the same as that of at least one of the first and second additives 310a and 320a. The detector 400 may detect a silicon concentration in the etchant 330.

Referring to FIGS. 1, 2, and 3, the silicon concentration in the etchant 330 may have a desired or predetermined value C1. When the etchant 330 has a silicon concentration less than the desired or predetermined value C1, the first additive 310a may be separately supplied to the process bath 200. The first additive 310a may include, for example, a silicon compound such, that the silicon concentration in the etchant 330 may increase. The first additive 310a and the primary etchant 300a may be supplied separately from each other. The process bath 200 may be provided therein with the substrate 100 including the thin-layer structure TS in which the trench T is formed as illustrated in FIGS. 12A and 12B. The substrate 100 may be provided in plural in the process bath 200, and the plurality of substrates 100 may be simultaneously soaked in the etchant 330. Each of the substrates 100 may include the thin-layer structure TS in which the trench T is formed. An etching process for selectively etching the sacrificial layers 104 (i.e., silicon nitride layers) may be performed in the process bath 200. In this case, as the silicon concentration in the etchant 330 reaches the value C1, the etchant 330 may have a desired etch selectivity to, the insulation layers 106 (i.e., silicon oxide layers). Accordingly, loss of the insulation layers 106 may be suppressed during the etching process.

Referring to FIGS. 1, 2, and 16, as the sacrificial layers 104 are etched, the silicon concentration in the etchant 330 during the etching process may increase. In detail, the etchant 330 may include silicon (Si) generated by the etching of the sacrificial layers 104, and, thus, the silicon concentration in the etchant 330 may increase during the etching process. When the silicon concentration in the etchant 330 reaches a limit value $C1_{limit}$ thicknesses of the insulation layers 106 may increase due to oxide growth (referred to hereinafter as an abnormal growth phenomenon) on surfaces of the insulation layers 106. To suppress the abnormal growth phenomenon, the process bath 200 may be supplied with the second additive 320a during the etching process. For example, the second additive 320a may not include a silicon source, but include a material that suppresses supersaturation of silicon in the etchant 330. The second additive 320a may include, for example, an ammonium compound. The second additive 320a may be supplied separately from the first additive 310a and the primary etchant 300a. The second, additive 320a may be continuously or discontinuously supplied to the process bath 200 during the etching process. Depending on amounts of the primary etchant 300a and the first additive 310a supplied to the process bath 200, the silicon concentration in the etchant 330 may be maintained within a desired concentration range during the etching process.

Referring to FIGS. 2 and 17 to 19, as the silicon concentration in the etchant 330 is variously controlled within the described concentration range during the etching process, an inner surface profile of each of the recess regions R may be diversely controlled. For one example, when the silicon concentration in the etchant 330 is controlled to so as to be substantially constant (Cc) within the desired concentration range for a duration from the specific time Ts to the end time $T_{end}$, as shown in FIG. 17, loss of the insulation layers 106 may be reduced or minimized during the etching process. For another example, when the silicon concentration in the etchant 330 is controlled so as to be substantially decreased (Cd) within the desired concentration range for a duration from the specific time Ts to the end time $T_{end}$, the etchant 330 may exhibit a decreased etch selectivity to the insulation layers 106. Accordingly, as shown in FIG. 18, the insulation layers 106 may be further etched toward the semiconductor pattern 122 during the etching process. For another example, when the silicon concentration in the etchant 330 is controlled so as to be substantially increased (Ci) within the desired concentration range for a duration from the specific time Ts to the end time $T_{end}$, the etchant 330 may exhibit an increased etch selectivity to the insulation layers 106. Accordingly, as shown in FIG. 19, the insulation layers 106 may be etched less toward the semiconductor pattern 122 during the etching process. Hence, a surface profile of each of the insulation layers 106, i.e., the inner surface profile of each of the recess regions R may be configured based on the silicon concentration in the etchant over time.

In other embodiments, the wet etching method described with reference to FIGS. 3 to 5 and 8 may be used to form the recess regions R according to some embodiments of the present inventive concept. For brevity of the description, omission will be made to avoid duplicate explanation of the example of a wet etching method discussed with reference to FIGS. 2 to 7.

According to exemplary embodiments of the present inventive concept, the process bath 200 may be provided therein with the substrate 100 including the thin-layer structure TS in which the trench Tis formed, as illustrated in FIGS. 12A and 12B. The substrate 100 may be provided in plural in the process bath 200, and the plurality of substrates 100 may be simultaneously soaked in the etchant 330. An etching process for selectively etching the sacrificial layers 104 (i.e., silicon nitride layers) may be performed in the process bath 200. The etching process on the plurality of substrates 100 may be defined so as to be referred to as a first batch processing 1Batch.

Referring to FIGS. 1, 8, and 16, as the sacrificial layers 104 are etched, the silicon concentration in the etchant 330 may increase during the etching process (i.e., the first batch processing 1Batch).

Referring to FIGS. 1, 8, and 17, the first batch processing 1Batch may selectively etch the sacrificial layers 104. The silicon concentration in the etchant 330 may increase during the first batch processing 1Batch, and, thus, loss of the insulation layers 106 may be reduced or minimized during the first batch processing 1Batch. After the first batch processing 1Batch is terminated, the plurality of substrates 100 may be unloaded from the process bath 200. Thereafter, an additional plurality of substrates 100 may be provided in the process bath 200 and simultaneously soaked in the etchant 330. The etching process on the additional plurality of substrates 100 may be defined so as to be referred to as a second batch processing 2Batch.

Referring to line P of FIG. 8, after the first batch processing 1Batch, the silicon concentration in the etchant 330 may have a value closer to a limit value $C_{limit}$. When the second batch processing 2Batch is performed using the etchant 330, the silicon concentration in the etchant 330 may increase so as to reach the limit value $C_{limit}$. In this case, the abnormal growth phenomenon described above may occur. To suppress the abnormal growth phenomenon, the process bath 200 may be supplied with the second additive 320a at a time Ts' after the first batch processing 1Batch and before the second batch processing 2Batch. As the process bath 200 is supplied with the second additive 320a, the abnormal growth phenomenon may be suppressed even though the silicon concentration in the etchant 330 exceeds the limit value $C_{limit}$. The second batch processing 2Batch may, thus, be performed even when the silicon concentration in the etchant 330 is above the limit value $C_{limit}$. That is, a limit value of the concentration of silicon in the etchant 330 may increase ($C_{limit} \rightarrow C_{limit}'$).

Referring to line Q of FIG. 8, to decrease the silicon concentration in the etchant 330, the process bath 200 may be supplied with the primary etchant 300a at the time Ts' after the first batch processing 1Batch and before the second batch processing 2Batch. The primary etchant 300a may be supplied separately from the first additive 310a and the second additive 320a, As the process bath 200 is supplied with the primary etchant 300a, the etchant 330 may have a decreased silicon concentration. For example, the primary etchant 300a may be supplied to the process bath 200 so as to allow the silicon concentration in the etchant 330 to have the desired or predetermined value C1. Accordingly, the etchant 330 may have a desired etch selectivity to the silicon oxide layer 110 during the second batch processing 2Batch, and, as the silicon concentration in the etchant 330 decreases below the limit value $C_{limit}$, the abnormal growth phenomenon may be suppressed. In some embodiments, the process bath 200 may be simultaneously supplied with the primary etchant 300a and the second additive 320a at the time Ts' of after the first batch processing 1Batch and before the second batch processing 2Batch. The primary etchant 300a may be supplied to the process bath 200 so as to allow the silicon concentration in the etchant 330 to have the desired or predetermined value C1. The etchant 330 may, thus, have a desired etch selectivity to the insulation layers 106 during the second batch processing 2Batch. In addition, as the process bath 200 is supplied with the second additive 320a, the abnormal growth phenomenon may be suppressed.

As the supply amounts of the primary etchant 300a and the first additive 310a are controlled when added into the process bath 200 during the first batch processing 1Batch, it may be possible to control an increasing slope S of the silicon concentration in the etchant 330. In this case, as discussed with reference to FIG. 19, the etch selectivity of the etchant 330 to the insulation layers 106 may be controlled. The inner surface profile for each of the recess regions R may likewise be configured based on the silicon concentration in the etchant.

Figure 14A:
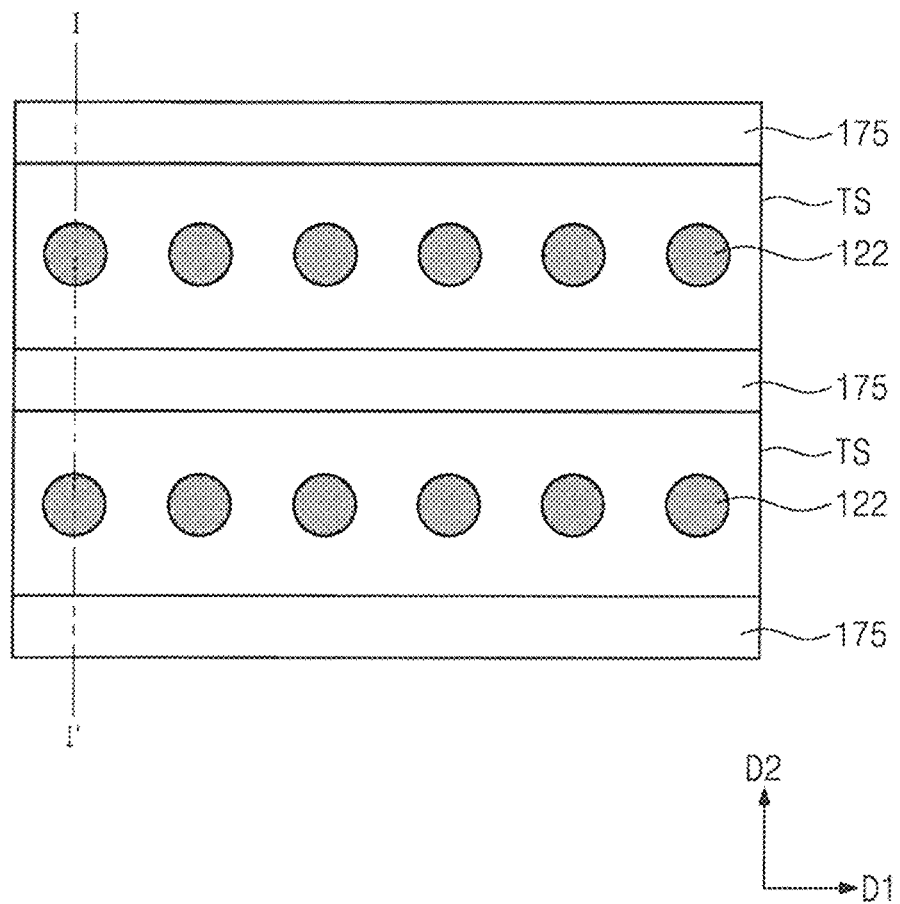
Figure 14B:
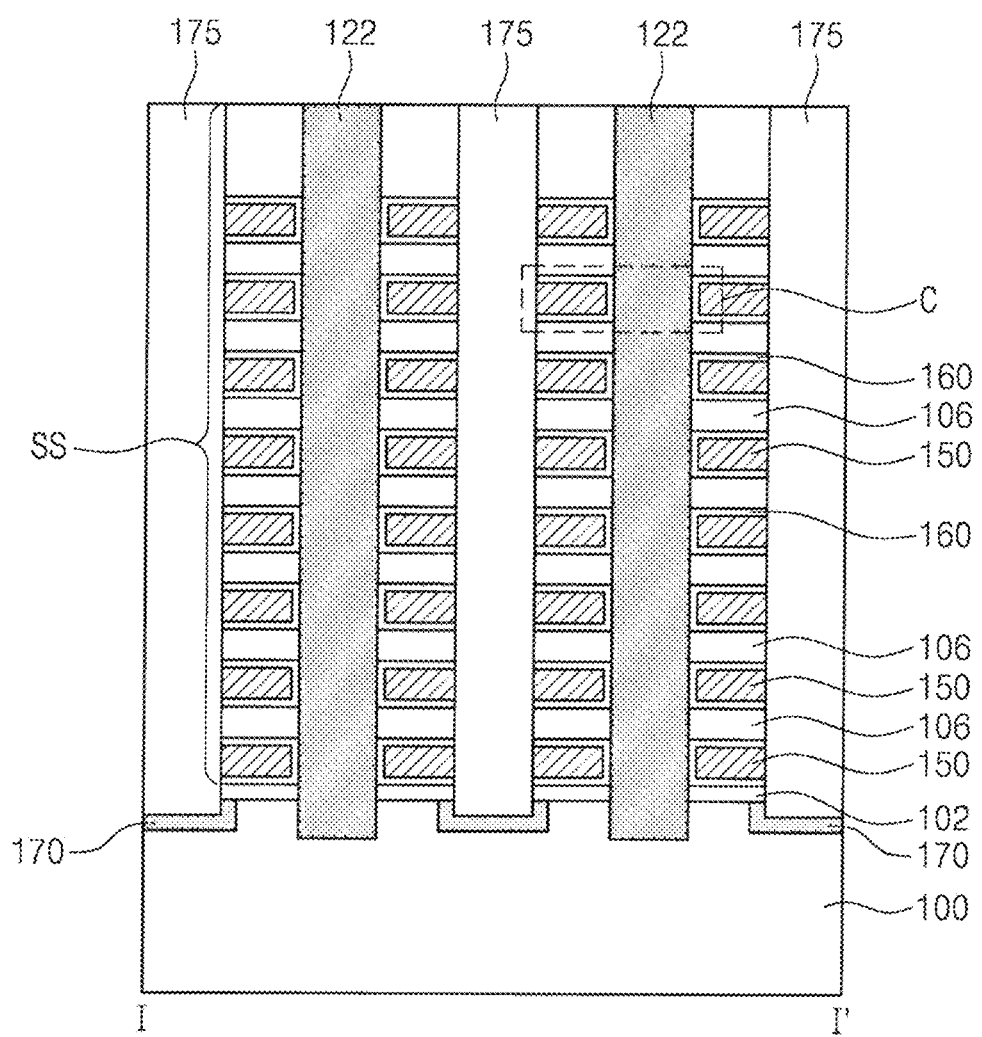

Referring to FIGS. 14A and 14B, after the recess regions R are formed, horizontal insulators 160 may be formed to cover inner surfaces of the recess regions R, and gate electrodes 150 may be formed to fill remaining spaces of the recess regions R.

The formation of the horizontal insulators 160 and the gate electrodes 150 may include forming a horizontal insulation layer and a conductive layer to sequentially cover the recess regions R and removing the horizontal insulation layer and the conductive layer from the trench T to locally form the horizontal insulators 160 and the gate electrodes 150 in the recess regions R. The horizontal insulation layer may comprise a single thin layer or a plurality of thin layers in accordance with various embodiments. In some embodiments, the horizontal insulation layer may include a tunnel insulation layer adjacent to the semiconductor pattern 122, a blocking insulation layer adjacent to the gate electrodes 150, and a charge storage layer between the tunnel and blocking insulation layers. The blocking insulation layer may be formed of, for example, a silicon oxide layer. The charge storage layer may include a trap insulation layer or an insulation layer including conductive nano-dots. For example, the charge storage layer may include at least one of a silicon nitride layer, a silicon oxynitride layer, a silicon-rich nitride layer, a nanocrystalline silicon layer, or a laminated trap layer. The tunnel insulation layer may comprise one or more materials having a band gap greater than that of the charge storage layer. For example, the tunnel insulation layer may include a silicon oxide layer. The conductive layer may be formed to conformally cover an inner sidewall of the trench T while filling the recess regions R. In this case, the formation of the gate electrodes 150 may include using an isotropic etching method to remove the conductive layer from the trench T. Alternatively, in other embodiments, the conductive layer may be formed to fill the trench T, and in this case, the formation of the gate electrodes 150 may include using an anisotropic etching method to remove the conductive layer from the trench T. In some embodiments, the formation of the conductive layer may include sequentially depositing a barrier metal layer and a metal layer. The barrier metal layer may include, for example, a metal nitride layer, such as TiN, TaN, or WN, and the metal layer may include, for example, a metallic material, such as W, Al, Ti, Ta, Co, or Cu. A stack structure SS may be defined to include the gate electrodes 150 and the insulation layers 106 interposed therebetween.

As described with reference to FIGS. 13A and 13B, the recess regions R may be formed using the example wet etching process described with reference to FIGS. 2 to 7 according to some embodiments of the present inventive concept. In this case, the etchant 330 may be controlled to allow its silicon concentration to change within a desired concentration range during the etching process for forming the recess regions R. For example, as described with reference to FIGS. 2 and 17, the silicon concentration in the etchant 330 may be controlled so as to be substantially constant (Cc) within the desired concentration range a for duration from the specific time Ts to the end time $T_{end}$. In this case, as shown in FIG. 20, the gate electrodes 150 may be formed to have substantially the same width W. For another example, as described with reference to FIGS. 2 and 18, the silicon concentration in the etchant 330 may be controlled so as to be substantially decreased (Cd) within the desired concentration range for a duration from the specific time Ts to the end time $T_{end}$. In this case, as shown in FIG. 21, each of the gate electrodes 150 may be formed to have a width that increases when approaching the semiconductor pattern 122, i.e., W1<W2. For another example, as described with reference to FIGS. 2 and 19, the silicon concentration in the etchant 330 may be controlled so as to be substantially increased (Ci) within the desired concentration range for duration from the specific time Ts to the end time $T_{end}$. In this case, as shown in FIG. 22, each of the gate electrodes 150 may be formed to have a width that decreases when approaching the semiconductor pattern 122, i.e., W1>W2.

In some embodiments, the etchant 330 may be controlled to allow its silicon concentration to change within the desired concentration range during the etching process for forming the recess regions R, and, therefore, the inner surface profile of each of the recess regions R may be modified so as to have a desired configuration. As a result, the characteristics of the gate electrodes 150 may likewise be modified.

Referring back to FIGS. 14A and 14B, after the gate electrodes 150 are formed, a common source region 170 may be formed in the substrate 100. The common source region 170 may be formed by performing an ion implantation on the substrate 100 exposed through the trench T. The common source region 170 may have a conductivity different from that of the semiconductor pattern 122. In contrast, a portion of the substrate 100 in contact with the semiconductor pattern 122 may have the same conductivity as that of the semiconductor pattern 122. According to some embodiments for flash memory devices, a plurality of common source regions 170 may be connected to each other to have the same electrical potential. Alternatively, in other embodiments, the common source regions 170 may be electrically separated so as to have electrical potentials different from each other.

The common source region 170 may be provided thereon with an electrode separation pattern 175 formed to fill the trench T. The electrode separation pattern 175 may be formed of at least one of a silicon oxide layer, a silicon nitride layer, or a silicon oxynitride layer.

Figure 15A:
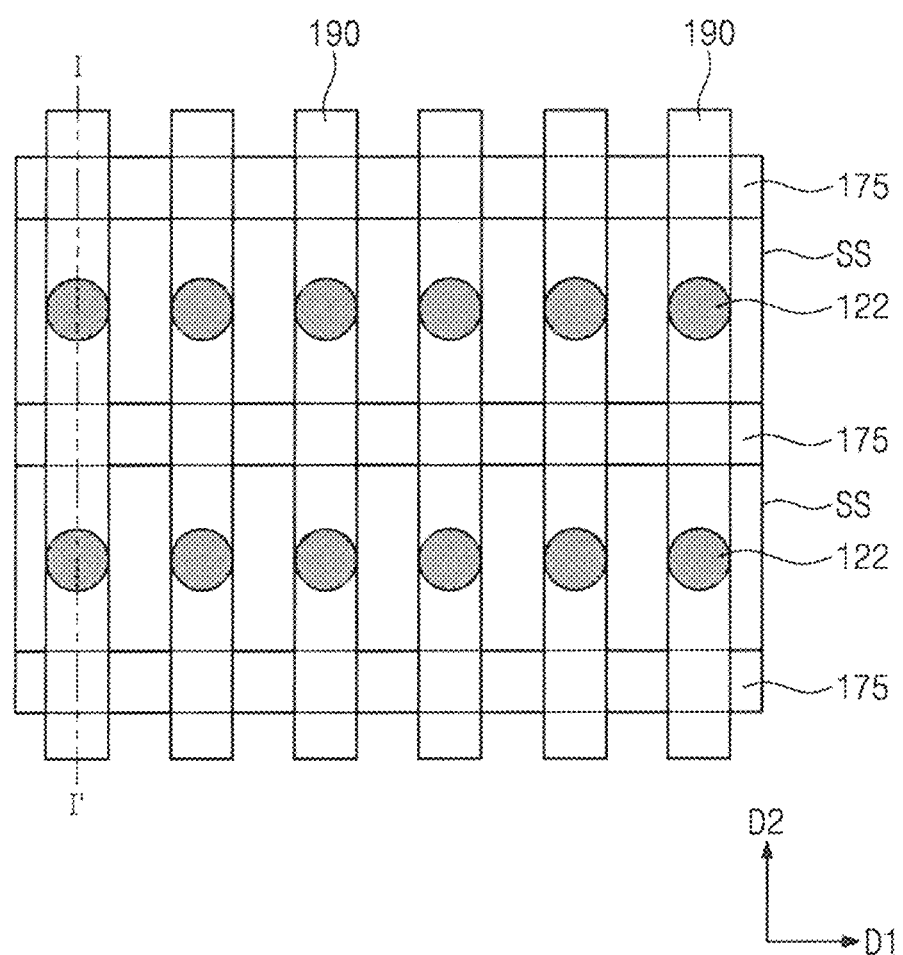
Figure 15B:
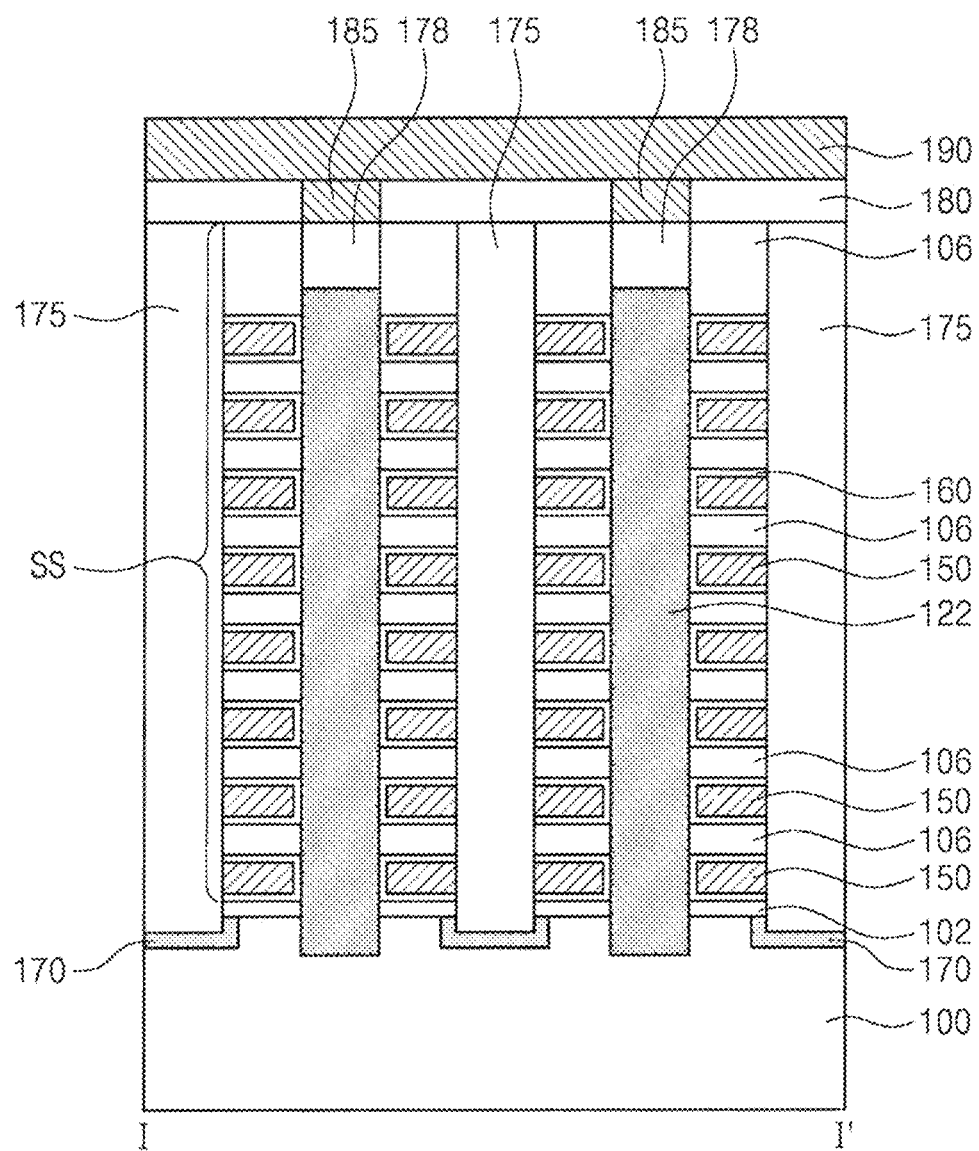

Referring to FIGS. 15A and 15B, a conductive pad 178 may be formed to connect with the semiconductor pattern 122. The conductive pad 178 may be formed by recessing an upper portion of the semiconductor pattern 122 and filling the recessed portion with a conductive material. Alternatively, the conductive pad 178 may be formed by doping impurities having a conductivity different from that of the semiconductor pattern 122. The stack structure SS may be provided thereon with a contact plug 185 in contact with the conductive pad 178 and a bit line 190 in contact with the contact plug 185. The bit line 190 may be electrically connected through the contact plug 185 to the semiconductor pattern 122. The bit line 190 may be formed to run across either the gate electrodes 150 or the trench T. The bit line 190 may be formed spaced apart from the stack structure SS across an interlayer dielectric layer 180.

According to embodiments of the present inventive concept, an etching process may be performed to selectively etch the sacrificial layers 104 to form the recess regions R. The primary etchant 300a, the first additive 310a, and the second additive 320a may be separately supplied to the process bath 200 where the etching process is performed. As the primary etchant 300a and the first additive 310a are separately controlled with respect to their supply amount and supply timing into the process bath 200, the silicon concentration in the etchant 330 may be controlled and accommodated in the process bath 200. When the silicon concentration in the etchant 330 changes during the etching process for forming the recess regions R, the inner surface profile of each of the recess regions R may be altered. This may change the electrode characteristics of the gate electrodes 150 formed in the recess regions R. In addition, as the second additive 320a is separately controlled with respect to its supply amount and supply timing into the process bath 200, the abnormal growth phenomenon, which may occur during the etching process, may be suppressed. As a result, the embodiments described herein may provide a method of fabricating a semiconductor device while reducing or suppressing the occurrence of defects.

According to embodiments of the present inventive concept, a primary etchant, a first additive, and a second additive may be separately supplied to a process bath where an etching process is performed. The primary etchant and the first additive may control a silicon concentration in an etchant accommodated in the process bath, and the second additive may decrease defects that may occur due to an increase of the silicon concentration in the etchant. As the primary etchant, the first additive, and the second additive are separately controlled with respect to their supply amounts and supply timings into the process bath, it may be possible to control the silicon concentration in the etchant and also to reduce or suppress the occurrence of defects during the etching process. Accordingly, embodiments of the present inventive concept may provide a method of wet etching in which an etch selectivity of the etchant controlled and the defects that may occur during the etching process may be reduced or suppressed.

In addition, when the wet etching method is used to fabricate a semiconductor device, embodiments of the present inventive concept may provide a method of fabricating a semiconductor device in which the occurrence of defects may be reduced or suppressed.

The aforementioned description provides exemplary embodiments for explaining the present inventive concept. Therefore, the present inventive concept is not limited to the embodiments described above, and it will be understood by one of ordinary skill in the art that variations in form and detail may be made therein without departing from the spirit and essential features of the inventive concept.

What is claimed is:

1. A method of wet etching, comprising:
providing a wafer in a process bath, the process bath accommodating therein an etchant;
supplying the process bath with a primary etchant to control a concentration of a specific material in the etchant;
supplying the process bath with a first additive to increase the concentration of the specific material in the etchant; and
supplying the process bath with a second additive to suppress a defect caused by an increase in the concentration of the specific material in the etchant,
wherein the etchant comprises at least one of the primary etchant, the first additive, and the second additive,
wherein the first additive and the second additive are separately supplied to the process bath, and
wherein the second additive comprises an ammonium compound.

2. The method of claim 1, wherein the primary etchant comprises a material different from that contained in each of the first additive and the second additive.

3. The method of claim 1, wherein
the first additive comprises a silicon compound, and
the concentration of the specific material in the etchant is a silicon concentration in the etchant.

4. The method of claim 3, wherein increasing the concentration of the specific material in the etchant comprises increasing the silicon concentration in the etchant so as to have a predetermined value.

5. The method of claim 1, wherein
the concentration of the specific material in the etchant is a silicon concentration in the etchant, and
the second additive is supplied to the process bath at a time when the silicon concentration in the etchant has a certain value.

6. The method of claim 1, wherein the concentration of the specific material in the etchant during the etching process is based on supply amounts of the primary etchant and the first additive supplied to the process bath.

7. The method of claim 1, wherein the second additive is supplied to the process bath after an etching process is performed on the wafer and before an additional wafer is provided to the process bath.

8. A method of fabricating a semiconductor device, comprising:
forming a thin-layer structure including oxide layers and nitride layers alternately and repeatedly stacked on a substrate;
forming a trench penetrating the thin-layer structure; and
removing the nitride layers exposed through the trench,
wherein removing the nitride layers comprises:
providing the substrate in a process bath where an etching process is performed to remove the nitride layers, the process bath accommodating therein an etchant;
supplying the process bath with a first additive to increase a concentration of a specific material in the etchant; and
supplying the process bath with a second additive to suppress a defect caused by an increase in the concentration of the specific material in the etchant,
wherein the first additive and the second additive are separately supplied to the process bath.

9. The method of claim 8, wherein the first additive and the second additive comprise different materials from each other.

10. The method of claim 9, wherein the first additive comprises a silicon compound, and
wherein increasing the concentration of the specific material in the etchant comprises increasing a silicon concentration in the etchant so as to have a predetermined value.

11. The method of claim 9, wherein
the concentration of the specific material in the etchant is a silicon concentration in the etchant, and
the second additive is supplied to the process bath at a time when the silicon concentration in the etchant has a certain value.

12. The method of claim 9, wherein the second additive is supplied to the process bath after the etching process is performed on the substrate and before an additional wafer is provided to the process bath.

13. The method of claim 8, wherein
the nitride layers are silicon nitride layers,
the etchant comprises phosphoric acid, and
each of the first additive and the second additive comprises a material different from phosphoric acid.

14. A method, comprising:
etching a substrate in a process bath during consecutive first and second non-overlapping time intervals using a primary etchant and a first additive, the first time interval including a commencement of the etching and the second time interval including a termination of the etching;
determining a concentration of a specific material in the process bath responsive to etching the substrate;
adjusting a supply amount of the primary etchant and the first additive in the process bath based on the concentration of the specific material such that the concentration of the specific material is below a threshold that facilitates oxide growth; and
supplying a second additive to the process bath that suppresses the oxide growth during both the first and second time intervals or during only the second time interval.

15. The method of claim 14, wherein the substrate has a plurality of oxide layers and nitride layers alternately stacked thereon and a semiconductor pattern that extends through the plurality of oxide layers and nitride layers; and
    wherein adjusting the supply amount of the primary etchant and the first additive comprises adjusting the supply amount of the primary etchant and the first additive so as to remove at least portions of the nitride layers and to configure sidewall profiles of the oxide layers, respectively.

16. The method of claim 15, wherein adjusting the supply amount of the primary etchant and the first additive in the process bath comprises adjusting the supply amount of the primary etchant and the first additive in the process bath such that the concentration of the specific material is one of substantially constant, increased, and decreased.

17. The method of claim 16, wherein a distance between sidewalls of adjacent oxide layers is greater nearer the semiconductor pattern than farther away from the semiconductor pattern when the concentration of the specific material is decreased; and
    wherein the distance between sidewalls of adjacent oxide layers is greater farther away from the semiconductor pattern than nearer the semiconductor pattern when the concentration of the specific material is increased.

* * * * *